US012781122B2

(12) United States Patent
Kwon et al.

(10) Patent No.: US 12,781,122 B2
(45) Date of Patent: Nov. 3, 2026

(54) SEMICONDUCTOR NANOPARTICLE, PRODCUTION METHOD THEREOF, ELECTRONIC DEVICE INCLUDING THE SAME

(71) Applicant: SAMSUNG ELECTRONICS CO., LTD., Suwon-si (KR)

(72) Inventors: Soo Kyung Kwon, Suwon-si (KR); Seungrim Yang, Suwon-si (KR); A Ra Jo, Suwon-si (KR); Seon-Yeong Kim, Suwon-si (KR); Nayoun Won, Suwon-si (KR); Jun Ho Lee, Suwon-si (KR); Mi Hye Lim, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 251 days.

(21) Appl. No.: 18/797,872

(22) Filed: Aug. 8, 2024

(65) Prior Publication Data

US 2025/0051640 A1 Feb. 13, 2025

(30) Foreign Application Priority Data

Aug. 8, 2023 (KR) ........................ 10-2023-0103799

(51) Int. Cl.
*C09K 11/62* (2006.01)
*B82Y 20/00* (2011.01)
(Continued)

(52) U.S. Cl.
CPC ............ *C09K 11/623* (2013.01); *C09K 11/02* (2013.01); *H10K 59/38* (2023.02); *B82Y 20/00* (2013.01);
(Continued)

(58) Field of Classification Search
None
See application file for complete search history.

(56) References Cited

U.S. PATENT DOCUMENTS 7,867,557 B2 1/2011 Pickett et al.
10,927,294 B2 2/2021 Mamuye et al.
(Continued)

FOREIGN PATENT DOCUMENTS

EP 4019608 A1 6/2022
EP 4245821 A1 9/2023
(Continued)

OTHER PUBLICATIONS

Park—WO 2013-162334 A1—MT—Zn—Ag—In—S nanoparticle—2013 (Year: 2013).*
(Continued)

*Primary Examiner* — John Vincent Lawler
(74) *Attorney, Agent, or Firm* — CANTOR COLBURN LLP

(57) ABSTRACT

A semiconductor nanoparticle, a method of manufacturing the semiconductor nanoparticle, and an electronic device including the nanoparticle are provided. The semiconductor nanoparticle includes silver, indium, gallium, and sulfur, wherein the semiconductor nanoparticle is configured to emit a green light, wherein the semiconductor nanoparticle has a relative mole value of zinc as defined by Equation 1 that is greater than or equal to about 0.25 and less than or equal to about 0.9:

$$\text{Relative mole value of zinc} = [Zn]/([Ag]+[In]+[Ga]+[Zn]) \quad \text{Equation 1}$$

(Continued)

wherein, in Equation 1,

[Ag], [In], [Ga], and [Zn] are molar amounts of the silver, the indium, the gallium, and the zinc in the semiconductor nanoparticle, respectively, and wherein a mole ratio of gallium to indium is greater than about 2.5:1 and less than about 5.6:1.

18 Claims, 16 Drawing Sheets
(2 of 16 Drawing Sheet(s) Filed in Color)

(51) Int. Cl.

| | |
|---|---|
| ***B82Y 40/00*** | (2011.01) |
| ***C09K 11/02*** | (2006.01) |
| ***G02F 1/13357*** | (2006.01) |
| ***H10K 59/38*** | (2023.01) |

(52) U.S. Cl.

CPC ......... *B82Y 40/00* (2013.01); *G02F 1/133617* (2013.01)

(56) References Cited

U.S. PATENT DOCUMENTS

| | | | | |
|---|---|---|---|---|
| 11,970,646 | B2 | 4/2024 | Mamuye et al. | |
| 2008/0277625 | A1 | 11/2008 | Nakamura et al. | |
| 2015/0162468 | A1 | 6/2015 | Newman | |
| 2017/0052444 | A1 | 2/2017 | Park et al. | |
| 2021/0363422 | A1* | 11/2021 | Nikata | C09K 11/883 |
| 2023/0165026 | A1* | 5/2023 | Torimoto | B82Y 30/00 252/301.36 |
| 2024/0107792 | A1* | 3/2024 | Goto | C09K 11/02 |

FOREIGN PATENT DOCUMENTS

| | | | | |
|---|---|---|---|---|
| EP | 4372066 | A1 | 5/2024 | |
| JP | 2019151832 | A | 9/2019 | |
| KR | 1508568 | B1 | 4/2015 | |
| KR | 20190119457 | A * | 10/2019 | C09K 11/623 |
| KR | 2047116 | B1 | 11/2019 | |
| KR | 20210007738 | A | 1/2021 | |
| KR | 20210036978 | A | 4/2021 | |
| WO | 2006009124 | A1 | 1/2006 | |
| WO | WO-2013162334 | A1 * | 10/2013 | C09K 11/584 |

OTHER PUBLICATIONS

Yang—KR 2019-0119457 A—MT—quantum dot—nanoparticle—2019 (Year: 2019).*

Galiyeva—Thesis on doped Ag—In—Ga—Zn—S quantum dots and use in MR fluoscence—2021 (Year: 2021).*

Zhe Hu, et al., Aqueous synthesis of 79% efficient AgInGaS/ZnS quantum dots for extremely high color rendering white light-emitting diodes, J. Mater. Sci. Technol., vol. 134, pp. 189-196.

Extended European Search Report dated Jan. 2, 2025, of the corresponding European Patent Application No. 24193590.7, 7 pp.

* cited by examiner

SEMICONDUCTOR NANOPARTICLE, PRODCUTION METHOD THEREOF, ELECTRONIC DEVICE INCLUDING THE SAME

CROSS-REFERENCE TO RELATED APPLICATION

This application claims priority to Korean Patent Application No. 10-2023-0103799 filed in the Korean Intellectual Property Office on Aug. 8, 2023, and all the benefits accruing therefrom under 35 U.S.C. § 119, the entire content of which is incorporated herein by reference.

BACKGROUND

1. Field

A semiconductor nanoparticle, a method of producing method the semiconductor nanoparticle, and an electronic device including the semiconductor nanoparticle are disclosed.

2. Description of the Related Art

A semiconductor nanoparticle may exhibit different aspects, characteristics, or properties than a corresponding bulk material having substantially the same composition. For example, the semiconductor nanoparticle may have different physical properties based on the nanostructure (e.g., bandgap energy, a luminescent property, or the like). The semiconductor nanoparticle may be configured to emit light upon excitation by incident light or an applied voltage. The luminescent nanostructure may find applicability in a variety of devices (e.g., a display panel or an electronic device including the display panel). From an environmental point of view, developing a luminescent nanoparticle that does not contain a harmful heavy metal, such as cadmium, and yet achieving an improvement in one or more luminescent or optical properties is desirable.

SUMMARY

An aspect relates to a color conversion panel including a semiconductor nanoparticle capable of emitting light and exhibiting an improved optical property e.g., a relatively high excitation light absorbance or a narrow full width at half maximum) and an improved stability (for example, process stability and/or chemical stability.

An aspect relates to a population of the semiconductor nanoparticle.

An aspect relates to a method of producing the semiconductor nanoparticle.

An aspect relates to a color conversion panel including the semiconductor nanoparticle.

An aspect relates to a composition (e.g., an ink composition) including the semiconductor nanoparticle.

An aspect relates to an electronic device (e.g., a display device) including the semiconductor nanoparticle or the color conversion panel.

In an aspect, a semiconductor nanoparticle includes silver, indium, gallium, and sulfur, wherein the semiconductor nanoparticle is configured to emit a green light The semiconductor nanoparticle has a relative mole value of zinc as defined by Equation 1 that is greater than or equal to about 0.25 and less than or equal to about 0.9:

$$\text{relative mole value of zinc} = [Zn]/([Ag]+[In]+[Ga]+[Zn]) \quad \text{Equation 1}$$

wherein, in Equation 1,

[Ag], [In], [Ga], and [Zn] are molar amounts of the silver, the indium, the gallium, and the zinc in the semiconductor nanoparticle, respectively, and wherein a mole ratio of gallium to indium (Ga:In) is greater than about 2.5:1 and less than about 5.6:1, or less than or equal to about 5:1.

In an embodiment, the semiconductor nanoparticle may have a charge balance value represented by the following Equation 2 that is greater than or equal to about 0.8, greater than or equal to about 0.9, greater than or equal to about 0.93 and less than or equal to about 1.4, less than or equal to about 1.35, or less than or equal to about 1.1:

$$\text{charge balance value} = \{[Ag]+3([In]+[Ga])+2[Zn]\}/2[S] \quad \text{Equation 2}$$

wherein, in Equation 2, [Ag], [In], [Ga], [Zn], and [S] are molar amounts of silver, indium, gallium, zinc, and sulfur in the semiconductor nanoparticle, respectively.

In the semiconductor nanoparticle, the relative mole value of zinc may be greater than or equal to about 0.28, greater than or equal to about 0.35, and less than or equal to about 0.48, less than or equal to about 0.43, less than or equal to about 0.33, or less than or equal to about 0.31.

In the semiconductor nanoparticle, the relative mole value of zinc may be greater than about 0.48, or greater than or equal to about 0.6, and less than or equal to about 0.75, or less than or equal to about 0.67.

In the semiconductor nanoparticle, a mole ratio of gallium to indium (Ga:In) may be greater than or equal to about 2.9:1, or greater than or equal to about 3.5:1. In the semiconductor nanoparticle, a mole ratio of gallium to indium (Ga:In) may be less than or equal to about 5:1, less than or equal to about 4.5:1, less than or equal to about 4:1, or less than or equal to about 3.9:1.

In the semiconductor nanoparticle, a mole ratio of gallium to a sum of indium and gallium (Ga:(In+Ga)) may be greater than about 0.72:1 or greater than or equal to about 0.73:1, and less than or equal to about 0.84:1 or less than or equal to about 0.8:1.

In the semiconductor nanoparticle, a mole ratio of zinc to indium (Zn:In) may be greater than or equal to about 2.7:1, and less than or equal to about 10.5:1 or less than or equal to about 5.9:1.

In the semiconductor nanoparticle, a mole ratio of sulfur to indium (S:In) may be greater than or equal to about 7.5:1 or greater than or equal to about 9:1, and less than or equal to about 17:1 or less than or equal to about 12:1.

In the semiconductor nanoparticle, a mole ratio of silver to indium (Ag:In) may be greater than or equal to about 1.1:1 or greater than or equal to about 2.1:1, and less than or equal to about 5:1 or less than or equal to about 3.1:1.

In the semiconductor nanoparticle, a mole ratio of gallium to silver (Ga:Ag) may be greater than or equal to about 1.1:1 or greater than or equal to about 1.4:1, and less than or equal to about 3:1 or less than or equal to about 2.8:1.

In the semiconductor nanoparticle, a mole ratio of gallium to a sum of gallium, indium, and silver (Ga:(Ga+In+Ag))

may be greater than or equal to about 0.45:1 or greater than or equal to about 0.48:1, and less than or equal to about 0.7:1 or less than or equal to about 0.6:1.

In the semiconductor nanoparticle, a mole ratio of zinc to sulfur (Zn:S) may be greater than or equal to about 0.1:1. In the semiconductor nanoparticle, a mole ratio of zinc to sulfur (Zn:S) may be less than or equal to about 0.8:1.

In the semiconductor nanoparticle, a mole ratio of a sum of indium and gallium to sulfur ((In+Ga):S) may be greater than or equal to about 0.1:1 or greater than or equal to about 0.25:1. A mole ratio of a sum of indium and gallium to sulfur ((In+Ga):S) may be less than or equal to about 0.8:1 or less than or equal to about 0.5:1.

In the semiconductor nanoparticle, a mole ratio of silver to sulfur (Ag:S) may be greater than or equal to about 0.1:1. The mole ratio of silver to sulfur (Ag:S) may be less than or equal to about 0.5:1 or less than or equal to about 0.33:1.

In the semiconductor nanoparticle, a mole ratio of silver to a sum of silver, indium, and gallium (Ag:(Ag+In+Ga)) may be greater than or equal to about 0.2:1 or greater than or equal to about 0.3:1. In the semiconductor nanoparticle, a mole ratio of silver to a sum of silver, indium, and gallium (Ag:(Ag+In+Ga)) may be less than or equal to about 0.5:1 or less than or equal to about 0.4:1.

In the semiconductor nanoparticle, a mole ratio of sulfur to a sum of silver, indium, and gallium (S:(Ag+In+Ga)) may be greater than or equal to about 1:1. In the semiconductor nanoparticle, a mole ratio of sulfur to a sum of silver, indium, and gallium (S:(Ag+In+Ga)) may be less than or equal to about 2.5:1.

In the semiconductor nanoparticle, a mole ratio of sulfur to a sum of silver, indium, gallium, and zinc (S:(Ag+In+Ga+Zn)) may be greater than or equal to about 0.8 and less than or equal to about 1.3:1.

In the semiconductor nanoparticle, a mole ratio of a sum of indium and gallium to silver ((In+Ga):Ag) may be greater than or equal to about 1.4:1 and less than or equal to about 3.7:1.

The semiconductor nanoparticle may include a first particle including silver, indium, gallium, and sulfur, and a semiconductor nanocrystal layer disposed on the first particles and including zinc and sulfur.

The first particle may include a first semiconductor nanocrystal and optionally a second semiconductor nanocrystal. The first semiconductor nanocrystal may include silver, indium, gallium, and sulfur.

The first semiconductor nanocrystal or the first particle may not include zinc.

In the semiconductor nanoparticle, the second semiconductor nanocrystal may be disposed on the first semiconductor nanocrystal or may surround at least a portion of the first semiconductor nanocrystal. The second semiconductor nanocrystal may include gallium, sulfur, and optionally silver. The semiconductor nanocrystal layer may include a third semiconductor nanocrystal including zinc and sulfur. The second semiconductor nanocrystal may have a composition different from the first semiconductor nanocrystal and the third semiconductor nanocrystal. The third semiconductor nanocrystal may include a zinc sulfide. The third semiconductor nanocrystal may have a composition different from that of the first semiconductor nanocrystal. The semiconductor nanocrystal layer or the third semiconductor nanocrystal may provide an outermost layer of the semiconductor nanoparticle.

In the semiconductor nanoparticle, the second semiconductor nanocrystal may be disposed between the first semiconductor nanocrystal and the semiconductor nanocrystal layer.

In the semiconductor nanoparticle, an amount (or a concentration) of indium in a portion proximate to or adjacent to the surface of the particle may be less than in a center portion (e.g., a core) of the particle. In the nanoparticle, an amount (or a concentration) of zinc in a portion proximate or adjacent to a surface of the particle may be greater than in a center portion (e.g., a core) of the particle. In the nanoparticle, a concentration of zinc may be greater at an outside portion than inside the particle closer to the core.

A thickness of the semiconductor nanocrystal layer may be greater than or equal to about 0.1 nm, or greater than or equal to about 0.5 nm. A thickness of the semiconductor nanocrystal layer may be less than or equal to about 5 nm, less than or equal to about 3 nm, less than or equal to about 1.5 nm, less than or equal to about 1 nm, or less than or equal to about 0.8 nm.

The green light may include band edge emission.

The green light may have a peak emission wavelength of greater than or equal to about 500 nm or greater than or equal to about 505 nm, and less than or equal to about 580 nm or less than or equal to about 550 nm.

The semiconductor nanoparticle may have a (absolute) quantum yield of greater than or equal to about 65% or greater than or equal to about 70%. The quantum yield may be less than or equal to about 98% or less than or equal to about 85%.

The semiconductor nanoparticle may have a full width at half maximum of less than or equal to about 40 nm or less than or equal to about 35 nm. The full width at half maximum may be greater than or equal to about 5 nm, greater than or equal to about 10 nm, greater than or equal to about 15 nm, or greater than or equal to about 25 nm.

The semiconductor nanoparticle may have a trap emission percentage obtained by the following equation 3 that is less than or equal to about 25%, less than or equal to about 20%, less than or equal to about 19%, less than or equal to about 18%, or less than or equal to about 17%:

$$\text{trap emission percentage (\%)} = [\text{a trap emission area of emission spectrum/ a total area of the emission spectrum}] \times 100. \quad \text{Equation 3}$$

In Equation 3, the trap emission area refers to a peak area with (e.g., corresponding to) a wavelength of greater than a peak emission wavelength plus 50 nm.

A method of manufacturing a semiconductor nanoparticle of an embodiment includes reacting a zinc precursor with a sulfur precursor in the presence of a first particle containing indium, gallium, silver, and sulfur to form a semiconductor nanocrystal layer containing zinc and sulfur on the first particle. The reaction includes adding the first particle and the zinc precursor to a reaction medium including the sulfur precursor and a first organic solvent, and conducting a reaction at a temperature of greater than about 180° C. and less than about 240° C.

The sulfur precursor may include a thiol compound, an isothiocyanate compound, a thiourea compound, or a combination thereof.

The zinc precursor may contain a zinc halide.

The reaction temperature may be greater than or equal to about 205° C. and less than or equal to about 220° C.

The time for the reaction may be greater than or equal to about 10 minutes and less than or equal to about 5 hours.

The time for the reaction can be greater than or equal to about 30 minutes or more and less than or equal to about 2 hours.

The first organic solvent may include a C5 to C40 aliphatic (e.g., alkane, alkene, or alkyne) hydrocarbon solvent, a C6 to C40 aromatic hydrocarbon solvent, a C5 to C40 amine solvent (e.g., an aliphatic amine solvent), or a combination thereof.

The first organic solvent may contain a mixture of two or more organic solvents.

The mixture of the organic solvent may be a mixture of a first solvent including a C5 to C40 aliphatic hydrocarbon solvent and a second solvent including a C5 to C40 amine solvent. In the mixture of the organic solvent, a mixing ratio between the first solvent and the second solvent may be from about 1:0.01 to 1:10, from about 1:0.03 to 1:9, from about 1:0.05 to 1:8, from about from about 1:0.07 to 1:7, from about 1:0.1 to 1:6, from about 1:0.2 to 1:5, from about 1:0.5 to 1:2, from about 1:0.8 to 1:1.3, or a combination thereof. In an embodiment, an amount of the first solvent in the organic solvent mixture may be greater than an amount of the second solvent.

In an embodiment, the first particle may be prepared by a method that includes:

obtaining the first semiconductor nanocrystal including silver, indium, gallium, and sulfur;

preparing a reaction medium including a first precursor in a second organic solvent;

heating the reaction medium to a first temperature;

adding the first semiconductor nanocrystal and a second precursor to the reaction medium, wherein one of the first precursor and the second precursor is a gallium precursor and the other is a sulfur precursor; and heating the reaction medium to a second temperature and reacting for a first reaction time to form the first particle (for example, including the first semiconductor nanocrystal and the second semiconductor nanocrystal), wherein the first temperature is greater than or equal to about 120° C. to less than or equal to about 280° C., and the second temperature is greater than or equal to about 190° C. and less than or equal to about 380° C.

The reaction medium may further include an organic ligand.

In an embodiment, the first reaction time may be controlled so that the first particle may have a charge balance value defined by Equation 4 of greater than or equal to about 0.8 or greater than or equal to about 0.9, and less than or equal to about 1.3 or less than or equal to about 1.1:

$$\text{charge balance value} = \{[Ag] + 3([In] + [Ga])\}/2[S] \quad \text{Equation 4}$$

wherein, in Equation 4,

[Ag], [In], [Ga] and [S] are molar amounts of the silver, the indium, the gallium, and the sulfur in the first particle, respectively.

The first temperature and the second temperature may be different. The second temperature may be greater than the first temperature.

The gallium precursor may include a gallium halide, a gallium acetylacetonate, or a combination thereof. The second organic solvent may be the same as the first organic solvent. The second organic solvent may be different from the first organic solvent. The second organic solvent may include a substituted or unsubstituted C5 to C40 aliphatic hydrocarbon solvent, a substituted or unsubstituted C6 to C40 aromatic hydrocarbon solvent, a C5 to C40 amine solvent (e.g., an aliphatic amine solvent), or a combination thereof. The organic ligand may include a thiol compound.

The second temperature may be greater than or equal to about 250° C., greater than or equal to about 260° C., or greater than or equal to about 290° C. to less than or equal to about 330° C. The first reaction time may be greater than or equal to about 10 minutes to less than about 50 minutes. The second temperature may be less than about 290° C. (e.g., greater than or equal to about 200° C. to less than or equal to about 250° C.) and the first reaction time may be greater than or equal to about 30 minutes, and, for example, less than or equal to about 90 minutes, less than or equal to about 70 minutes, or less than or equal to about 60 minutes.

In an embodiment, an ink composition includes the semiconductor nanoparticle and a liquid vehicle. The semiconductor nanoparticle or a population thereof may be dispersed in the liquid vehicle. The liquid vehicle may include a liquid monomer, a (volatile) organic solvent, or a combination thereof. The ink composition may not substantially include a volatile organic solvent. The ink composition may further include a metal oxide fine particle.

In an embodiment, a composite includes a matrix and the semiconductor nanoparticle dispersed in the matrix. The composite may further include a metal oxide fine particle. The composite may be configured to emit green light. The composite may be a patterned film. The composite may further include a semiconductor nanoparticle configured to emit a second light different from the green light.

In an embodiment, when the composite is held at room temperature (e.g., 25° C.) in the air for 48 hours, a relative light emitting efficiency defined by the following equation may exceed 50%, or be 60% or more:

$$\text{Relative light emitting efficiency (\%)} = [\text{light emitting efficiency of the composite after 48 hours}/\text{Initial light emitting efficiency of the composite}] \times 100$$

An embodiment provides a color conversion layer (e.g., a color conversion structure or a color conversion panel) including a color conversion region containing the semiconductor nanoparticle described herein.

The color conversion panel includes a color conversion layer including a color conversion region and optionally a partition wall defining each region of the color conversion layer, the color conversion region includes a first region corresponding to a first pixel, and the first region includes the semiconductor nanoparticle or the composite.

In an embodiment, a display panel or an electronic device includes a light source and a color conversion layer (e.g., a color conversion structure) disposed on the light source.

In an embodiment, the display panel includes a light-emitting panel (or a light source), the color conversion panel, and optionally a light-transmitting layer positioned between the light-emitting panel and the color conversion panel.

The light emitting panel (or light source) may be configured to provide (or provides) an incident light to the color conversion panel. The incident light may include a blue light, and, optionally, a green light. The blue light may have a peak emission wavelength of about 440 nm to about 460 nm, or about 450 nm to about 455 nm.

The light source may include an organic light emitting diode (OLED), a micro LED, a mini LED, an LED including a nanorod, or a combination thereof.

In an embodiment, the electronic device (or display device) includes the color conversion panel or the display panel.

In an embodiment, a semiconductor nanoparticle includes silver, indium, gallium, and sulfur, wherein the semiconductor nanoparticle is configured to emit a green light, wherein the semiconductor nanoparticle has a relative mole value of zinc as defined by Equation 1 that is greater than or equal to about 0.25 and less than or equal to about 0.9:

$$\text{relative mole value of zinc} = [Zn]/([Ag]+[In]+[Ga]+[Zn]) \quad \text{Equation 1}$$

wherein, in Equation 1,

[Ag], [In], [Ga], and [Zn] are molar amounts of the silver, the indium, the gallium, and the zinc in the semiconductor nanoparticle, respectively, wherein a mole ratio of gallium to indium in the semiconductor nanoparticle is greater than about 2.5:1 and less than about 5.6:1, wherein the semiconductor nanoparticle has a charge balance value defined by Equation 2 that is greater than or equal to about 0.93 and less than or equal to about 1.17:

$$\text{charge balance value} = \{[Ag]+3([In]+[Ga])+2[Zn]\}/2[S] \quad \text{Equation 2}$$

wherein, in Equation 2, [Ag], [In], [Ga], [Zn], and [S] are molar amounts of silver, indium, gallium, zinc, and sulfur in the semiconductor nanoparticle, respectively, and wherein the semiconductor nanoparticle exhibits a trap emission percentage of less than or equal to about 25% as defined by the following formula:

$$\text{Trap emission percentage (\%)} = [\text{trap emission area in an emission spectrum}/\text{a total area of the emission spectrum}] \times 100$$

wherein the trap emission area is a peak area corresponding to a wavelength of greater than an emission peak wavelength plus 50 nm.

The semiconductor nanoparticle according to an aspect may exhibit improved optical properties, e.g., an improved blue light absorbance, a relatively narrow full width at half maximum, a relatively high light emitting efficiency, and/or suppressed trap emission) and/or may exhibit stability, e.g., a chemical and/or thermal stability, contributing to an improvement of device stability. The color conversion panel according to an aspect may utilize various light sources and may be usefully utilized in a liquid crystal display device, a quantum dot (QD) OLED display device, and/or a QD micro LED display device in which a QD color conversion layer or pixel is applied to a blue LED, blue-OLED, and/or a blue micro LED, respectively. The semiconductor nanoparticle and the color conversion panel may be applied to various devices such as TVs, monitors, mobile devices, VR/AR, automotive displays, or the like, but embodiments are not limited thereto.

BRIEF DESCRIPTION OF THE DRAWINGS

The patent or application file contains at least one drawing executed in color. Copies of this patent or patent application publication with the color drawing(s) will be provided by the Office upon request and payment of the necessary fee. The above and other aspects, features, and advantages of certain exemplary embodiments will be more apparent from the following detailed description taken in conjunction with the accompanying drawings.

DETAILED DESCRIPTION

Figure 1:
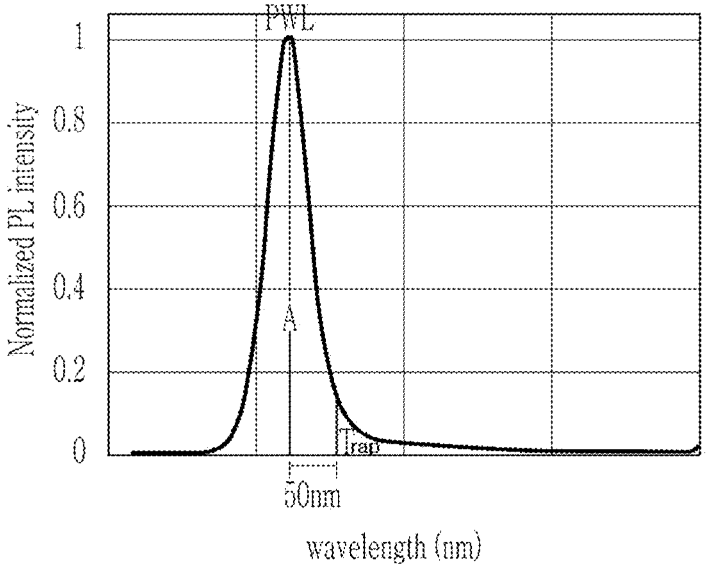
FIG. 1 is a model view illustrating a concept of a trap emission percentage.

Advantages and features of the techniques described hereinafter, and methods of achieving them, will become apparent with reference to the exemplary embodiments described below in further detail in conjunction with the accompanying drawings. However, the embodiments should not be construed as being limited to the exemplary embodiments set forth herein. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the singular forms "a," "an," and "the" are intended to include the plural forms, including "at least one," unless the context clearly indicates otherwise. For example, the wording "semiconductor nanoparticle" may refer to a single semiconductor nanoparticle or may refer to a plurality of semiconductor nanoparticles. "At least one" is not to be construed as being limited to "a" or "an." "Or" means "and/or." As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless mentioned to the contrary, a numerical range recited herein is inclusive. Unless mentioned to the contrary, a numerical range recited herein includes any real number within the endpoints of the stated range and includes the endpoints thereof. In this specification, a numerical endpoint or an upper or lower limit value (e.g., recited either as a "greater than or equal to value" "at least value" or a "less than or equal to value" or recited with "from" or "to") may be used to form a numerical range of a given feature. In other words, the upper and lower endpoints set forth for various numerical values may be independently combined to provide a range.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In one or more embodiments, substantially no amount of cadmium (or other harmful heavy metal) may be present or, if present, an amount of cadmium (or other harmful heavy metal) may be less than or equal to a detection limit or as an impurity level of a given analysis tool.

Hereinafter, as used herein, when a definition is not otherwise provided, "substituted" refers to replacement of at least one hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C7 to C30 arylalkyl group, a C6 to C30 aryloxy group, a C6 to C30 arylthio group, a C1 to C30 alkoxy group, a C1 to C30 alkylthio group, a C1 to C30 heteroalkyl group, a C3 to C30 heteroalkylaryl group, a C2 to C30 alkylheteroaryl group, a C2 to C30 heteroarylalkyl group, a C1 to C30 heteroaryloxy group, a C1 to C30 heteroarylthio group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group or an amine group (—NRR' wherein R and R' are each independently hydrogen or a C1 to C6 alkyl group), an azido group ($—N_3$), an amidino group ($—C(=NH)NH_2$), a hydrazino group ($—NHNH_2$), a hydrazono group ($=N(NH_2)$), an aldehyde group (—C(=O)H), a carbamoyl group ($—C(O)NH_2$), a thiol group (—SH), an ester group (—C(=O)OR, wherein R is a $C_1$ to $C_6$ alkyl group or a C6 to C12 aryl group), a carboxyl group (—COOH) or a salt thereof (—C(=O)OM, wherein M is an organic or inorganic cation, a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), or a combination thereof.

In addition, when a definition is not otherwise provided below, "hetero" means a case including 1 to 3 heteroatoms selected from N, O, P, Si, S, Se, Ge, and B.

In addition, the term "aliphatic hydrocarbon group" as used herein refers to a C1 to C30 linear or branched alkyl group, a C1 to C30 linear or branched alkenyl group, or a C1 to C30 linear or branched alkynyl group, and the term "aromatic organic group" as used herein refers to a C6 to C30 aryl group or a C2 to C30 heteroaryl group.

As used herein, the term "(meth)acrylate" refers to acrylate and/or methacrylate.

As used herein, the term "Group" refers to a Group of Periodic Table of Elements.

As used herein, the terms "a nanoparticle" and "a nanostructure" refer to a structure having at least one region or characteristic dimension with a nanoscale dimension. In one or more embodiments, the dimension of the nanoparticle or the nanostructure may be less than about 500 nm, less than about 300 nm, less than about 250 nm, less than about 150 nm, less than about 100 nm, less than about 50 nm, or less than about 30 nm. The nanoparticle or nanostructure may have any shape, such as a nanowire, a nanorod, a nanotube, a multi-pod type shape having two or more pods, a nanodot, or the like, but embodiments are not limited thereto. The nanoparticle or nanostructure may be, for example, substantially crystalline, substantially monocrystalline, polycrystalline, amorphous, or a combination thereof.

A quantum dot may be, for example, a semiconductor-containing nanocrystal particle that can exhibit a quantum confinement or exciton confinement effect and is a type of a luminescent nanostructure (e.g., capable of emitting light by energy excitation). Herein, a shape of the "quantum dot" or the nanoparticle is not limited unless otherwise expressly defined.

As used herein, the term "dispersion" refers to a dispersion in which a dispersed phase is a solid, and a continuous medium includes a liquid or a solid different from the dispersed phase. It is to be understood that the "dispersion" may be a colloidal dispersion in which the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm.

Herein, a dimension (a size, a diameter, or a thickness, etc.) may be a value for a single entity or an average value for a plurality of nanoparticles. As used herein, the term "average" (e.g., an average size of the quantum dot) may be a mean value or a median value. In one or more embodiments, the average may be "mean" average.

As used herein, the term "peak emission wavelength" is the wavelength at which a given emission spectrum of the light reaches its maximum.

In one or more embodiments, a quantum efficiency may be readily and reproducibly determined using commercially available equipment (e.g., from Hitachi or Hamamatsu, etc.) and referring to manuals provided by, for example, respective equipment manufacturers. The quantum efficiency (which can be interchangeably used with the term "quantum yield" (QY)) may be measured in a solution state or a solid state (i.e., in a composite). In one or more embodiments, the quantum efficiency (or the quantum yield) is the ratio of photons emitted to photons absorbed by the nanostructure or population thereof. In one or more embodiments, the quantum efficiency may be measured by any method. For example, there may be two methods for measuring the fluorescence quantum yield or efficiency: the absolute method and the relative method. The quantum efficiency measured by the absolute method may be referred to as an absolute quantum efficiency.

In the absolute method, the quantum efficiency may be obtained by detecting the fluorescence of all samples through an integrating sphere. In the relative method, the quantum efficiency of the unknown sample may be calculated by comparing the fluorescence intensity of a standard dye (a standard sample) with the fluorescence intensity of the unknown sample. Coumarin 153, Coumarin 545, Rhodamine 101 inner salt, Anthracene and Rhodamine 6G may be used as standard dyes according to their PL wavelengths, but embodiments are not limited thereto.

A full width at half maximum (FWHM) and a maximum emission (e.g., PL: photoluminescence or EL: electroluminescence) wavelength may be measured, for example, from a luminescence spectrum (for example, a photoluminescence spectrum or an electroluminescent spectrum) obtained by a spectrophotometer such as a fluorescence spectrophotometer or the like.

As used herein, the term "first absorption peak wavelength" refers to a wavelength at which a main peak first appears in a lowest energy region in the ultraviolet-visible (UV-Vis) absorption spectrum.

A semiconductor nanoparticle may be included in a variety of electronic devices. An electrical and/or an optical property of the semiconductor nanoparticle may be controlled for example, by the elemental composition of the semiconductor nanoparticle, the size of the semiconductor nanoparticle, and/or the shape of the semiconductor nanoparticle. In one or more embodiments, the semiconductor nanoparticle may be a semiconductor nanocrystal particle. The semiconductor nanoparticle such as a quantum dots may have a relatively large surface area per a unit volume, and thus, may exhibit a quantum confinement effect, exhibiting physical optical properties different from a corresponding bulk material having the same composition. Therefore, a semiconductor nanoparticle such as a quantum dot may absorb energy (e.g., incident light) supplied from an excitation source to form an excited state, which upon relaxation is capable of emitting an energy corresponding to its energy bandgap.

The semiconductor nanoparticle may also be used in a color conversion panel (e.g., a photoluminescent color filter) . Instead of a white light-emitting back light unit used in a liquid crystal display device, in a display device including a quantum dot-based color conversion panel or a luminescent type color filter, a quantum dot layer is used as a luminescent material and is disposed in a relatively front part of a device to convert an incident light (e.g., a blue light) provided from a light source to light of a different spectrum (for example, a green light or a red light). In such a color conversion panel, the color conversion of the excitation light may occur in a relatively front part of the device, the light may be scattered in all directions, which may address a viewing angle problem of the liquid crystal display, and a light loss problem caused by using an absorption type color filter may be addressed as well.

As used herein, the term "color conversion panel" refers to an electronic device including a color conversion layer. As used herein, the term "color conversion layer" also includes a structure including a color conversion region (e.g., a color conversion structure).

In the display device including the color conversion panel, properties (e.g., an optical property, stability, or the like) of a luminescent nanostructure may have a direct effect on a displaying quality of the device. It may be desired for the luminescent material included in the color conversion panel disposed in a relatively front portion of the device to exhibit not only a relatively high luminescent efficiency but also a relatively high absorbance with respect to an incident light. When a patterned film (e.g., a color filter) is used in the display device, a decreased absorbance to the incident light may be a direct cause of a blue light leakage, having an adversely effect on a color reproducibility (e.g., DCI match rate) of the device. An adoption of an absorption type color filter for preventing a blue leakage problem may lead to an additional decrease in a luminescent efficiency. Such a lowered absorbance of the semiconductor nanoparticle may result in a reduced luminance in a device including the same.

Semiconductor nanoparticles may exhibit properties (e.g., optical properties and/or stability) that may be applicable to a device, but many of them may include a cadmium-based compound (e.g., a cadmium chalcogenide). The cadmium causes a serious environment/health problem and thus is one of the restricted elements in many countries. Therefore, in order to develop cadmium-free environment-friendly nanoparticles, an in-depth research on nanocrystals based on Group III-V compounds has been conducted. However, there remains a technological need to develop an environmentally friendly nanoparticle that can exhibit a higher absorbance, a narrower the full width at half maximum, and a higher luminescent efficiency in comparison with a cadmium-free nanoparticle based on a Group III-V compound such as an indium phosphide.

In an embodiment, a semiconductor nanoparticle may not include cadmium. In one or more embodiments, the semiconductor nanoparticle may not include mercury, lead, or a combination thereof. It is to be understood that undesirable heavy metals include cadmium, mercury, and/or lead.

In an embodiment, the semiconductor nanoparticle includes silver, indium, gallium, zinc, and sulfur, and the semiconductor nanoparticle is configured to emit first light (e.g., green light or red light). The first light may be green light. The first light may be red light.

The semiconductor nanoparticle may have a relative mole value of zinc as defined by Equation 1 that is greater than or equal to about 0.25 and less than or equal to about 0.9:

$$\text{Relative mole value of zinc} = [Zn]/([Ag]+[In]+[Ga]+[Zn]) \quad \text{Equation 1}$$

wherein, in Equation 1,

[Ag], [In], [Ga], and [Zn] are molar amounts of the silver, the indium, the gallium, and the zinc in the semiconductor nanoparticle, respectively, and in the semiconductor nanoparticle, a mole ratio of gallium to indium (Ga:In) may be greater than about 2.5:1, and less than about 5.6:1 or less than or equal to about 5:1.

By having the structure/composition described herein, the semiconductor nanoparticle may emit light of a desired wavelength and may achieve an improved optical property (e.g., a relatively narrow full width at half maximum, an increased quantum yield, and/or a relatively high level of a blue light absorbance). The semiconductor nanoparticle of an embodiment can exhibit increased stability (chemical stability and/or thermal stability), and a composite including the same can exhibit a relatively high level of luminescent properties in comparison with its initial values even when the composite is exposed to the air for a period of time (e.g., about 48 or 72 hours). The semiconductor nanoparticle of an embodiment may be, for example, utilized as a down-conversion material for a color conversion panel or a color conversion sheet, and may exhibit an increased absorption per a given weight of semiconductor nanoparticles, and thus, a device (e.g., a panel or a sheet) including the same may be manufactured at a reduced production cost and may provide an improved photoconversion performance. In an embodiment, the semiconductor nanoparticle may exhibit a reduced or suppressed emission (e.g., trap emission) in an unwanted wavelength range.

The present inventors have found that, in the case of semiconductor nanoparticle containing a Group 13 metal and a chalcogen element along with silver (Ag), it may can be difficult to achieve the desired luminescent properties (e.g., increased quantum yield with a reduction in full width at half maximum). In addition, the inventors have found that by adjusting a composition of semiconductor nanoparticle including a Group 11-13-16 compound (e.g., charge balance values and/or molar ratios between elemental components described below) an improvement of the optical properties of the nanoparticles may be achieved. Unfortunately, however when the semiconductor nanoparticle(s) are included in a composite, the improved optical properties observed with the nanoparticles do not typically extend to the composite. In other words, the formation of the composite may negatively impact the prior optical improvements. When such a semiconductor nanoparticle is applied to a color conversion layer including a pixel (e.g., a red pixel, or a green pixel) configured to emit different colors, a relatively high dose of blue light may be incident on a relatively narrow area of the color conversion layer, and this can cause a photo-bleaching of the semiconductor nanoparticle or result in a deterioration of the polymer component of the composite. For the application of semiconductor nanoparticles in an actual device, the preparation of a composite including the semiconductor nanoparticle dispersed in a matrix (e.g., a polymer) may be conducted, involving the process of mixing the semiconductor nanoparticle with an organic material such as a polymer followed by heat/photocuring. The present inventors have found that the semiconductor nanoparticle may exhibit a decrease in efficiency in the process of manufacturing such a composite, and thus show a significantly decreased quantum efficiency in the composite, for example, when the composite is exposed to air for a period of time.

A semiconductor nanoparticle of one implementation may be manufactured according to the method described herein, and by exhibiting structures and/or characteristics as described herein, increased stability of the semiconductor nanoparticle may be achieved, and the semiconductor nanoparticle of an embodiment may contribute to an increase in reliability of the device.

In the semiconductor nanoparticle, a relative mole value of zinc may be greater than or equal to about 0.25, greater than or equal to about 0.255, greater than or equal to about 0.26, greater than or equal to about 0.265, greater than or equal to about 0.27, greater than or equal to about 0.275, greater than or equal to about 0.28, greater than or equal to about 0.285, greater than or equal to about 0.29, greater than or equal to about 0.295, greater than or equal to about 0.3, greater than or equal to about 0.31, greater than or equal to about 0.32, greater than or equal to about 0.33, greater than or equal to about 0.34, greater than or equal to about 0.35, greater than or equal to about 0.46, greater than or equal to about 0.37, greater than or equal to about 0.38, or greater than or equal to about 0.39. In the semiconductor nanoparticle, a relative mole value of zinc may be less than or equal to about 0.9, less than or equal to about 0.85, less than or equal to about 0.8, less than or equal to about 0.75, less than or equal to about 0.7, less than or equal to about 0.65, less than or equal to about 0.6, less than or equal to about 0.55, less than or equal to about 0.5, less than or equal to about 0.49, less than or equal to about 0.485, less than or equal to about 0.48, less than or equal to about 0.475, less than or equal to about 0.47, less than or equal to about 0.465, less than or equal to about 0.46, less than or equal to about 0.455, less than or equal to about 0.45, less than or equal to about 0.445, less than or equal to about 0.44, less than or equal to about 0.435, less than or equal to about 0.43, less than or equal to about 0.425, less than or equal to about 0.42, less than or equal to about 0.415, less than or equal to about 0.41, less than or equal to about 0.405, less than or equal to about 0.4, less than or equal to about 0.395, less than or equal to about 0.39, less than or equal to about 0.385, less than or equal to about 0.38, less than or equal to about 0.375, less than or equal to about 0.37, less than or equal to about 0.365, less than or equal to about 0.36, less than or equal to about 0.355, less than or equal to about 0.35, less than or equal to about 0.345, less than or equal to about 0.34, less than or equal to about 0.335, less than or equal to about 0.33, less than or equal to about 0.325, less than or equal to about 0.32, less than or equal to about 0.315, less than or equal to about 0.31, less than or equal to about 0.305, or less than or equal to about 0.3.

In the semiconductor nanoparticle, a mole ratio of gallium to indium (Ga:In) may be greater than 2.5:1, greater than 2.55:1, greater than or equal to about 2.6:1, greater than or equal to about 2.65:1, greater than or equal to about 2.7:1, greater than or equal to about 2.75:1, greater than or equal to about 2.8:1, greater than or equal to about 2.85:1, greater than or equal to about 2.9:1, greater than or equal to about 2.95:1, greater than or equal to about 3:1, greater than or equal to about 3.05:1, greater than or equal to about 3.1:1, greater than or equal to about 3.15:1, greater than or equal to about 3.2:1, greater than or equal to about 3.25:1, greater than or equal to about 3.3:1, greater than or equal to about 3.35:1, greater than or equal to about 3.4:1, greater than or equal to about 3.45:1, or greater than or equal to about 3.5:1. In the semiconductor nanoparticle, a mole ratio of gallium to indium (Ga:In) may be less than or equal to about 5.55:1, less than or equal to about 5.5:1, less than or equal to about 5.3:1, less than or equal to about 5.1:1, less than or equal to about 5:1, less than or equal to about 4.9:1, less than or equal to about 4.7:1, less than or equal to about 4.5:1, less than or equal to about 4.3:1, less than or equal to about 4:1, less than or equal to about 4.1:1, less than or equal to about 4:1, less than or equal to about 3.9:1, less than or equal to about 3.8:1, less than or equal to about 3.7:1, less than or equal to about 3.6:1, or less than or equal to about 3.55:1.

In the semiconductor nanoparticle, a mole ratio of gallium to a sum of indium and gallium (Ga:(In+Ga)) may be greater than or equal to about 0.71:1, greater than or equal to about 0.715:1, greater than or equal to about 0.72:1, greater than or equal to about 0.725:1, greater than or equal to about 0.73:1, greater than or equal to about 0.735:1, greater than or equal to about 0.74:1, greater than or equal to about 0.745:1, greater than or equal to about 0.75:1, greater than or equal to about 0.755:1, greater than or equal to about 0.76:1, greater than or equal to about 0.765:1, greater than or equal to about 0.77:1, greater than or equal to about 0.775:1, greater than or equal to about 0.78:1, greater than or equal to about 0.785:1, greater than or equal to about 0.79:1, or greater than or equal to about 0.795:1. In the semiconductor nanoparticle, a mole ratio of gallium to a sum of indium and gallium (Ga:(In+Ga)) may be less than or equal to about 0.845:1, less than or equal to about 0.84:1, less than or equal to about 0.835:1, less than or equal to about 0.83:1, less than or equal to about 0.825:1, less than or equal to about 0.82:1, less than or equal to about 0.815:1, less than or equal to about 0.81:1, less than or equal to about 0.805:1, less than or equal to about 0.8:1, less than or equal to about 0.795:1, less than or equal to about 0.79:1, less than or equal to about 0.785:1, less than or equal to about 0.78:1, less than or equal to about 0.775:1, or less than or equal to about 0.77:1.

In the semiconductor nanoparticle, a mole ratio of zinc to indium (Zn:In) may be greater than or equal to about 2.5:1, greater than or equal to about 2.55:1, greater than or equal to about 2.6:1, greater than or equal to about 2.65:1, greater than or equal to about 2.7:1, greater than or equal to about 2.75:1, greater than or equal to about 2.8:1, greater than or equal to about 2.85:1, greater than or equal to about 2.9:1, greater than or equal to about 2.95:1, greater than or equal to about 3:1, greater than or equal to about 3.05:1, greater than or equal to about 3.1:1, greater than or equal to about 3.2:1, greater than or equal to about 3.3:1, greater than or equal to about 3.4:1, greater than or equal to about 3.5:1, greater than or equal to about 3.6:1, greater than or equal to about 3.7:1, greater than or equal to about 3.8:1, greater than or equal to about 3.9:1, or greater than or equal to about 4:1. In the semiconductor nanoparticle, a mole ratio of zinc to indium (Zn:In) may be less than or equal to about 15:1, less than or equal to about 13:1, less than or equal to about 11:1, less than or equal to about 10.5:1, less than or equal to about 10:1, less than or equal to about 9.5:1, less than or equal to about 9:1, less than or equal to about 8.5:1, less than or equal to about 8:1, less than or equal to about 7.5:1, less than or equal to about 7:1, less than or equal to about 6.5:1, less than or equal to about 6:1, less than or equal to about 5.5:1, or less than or equal to about 5:1.

In the semiconductor nanoparticle, a mole ratio of sulfur to indium (S:In) may be greater than or equal to about 7.5:1, greater than or equal to about 7.6:1, greater than or equal to about 7.8:1, greater than or equal to about 8:1, greater than or equal to about 8.5:1, greater than or equal to about 9:1, greater than or equal to about 9.5:1, greater than or equal to about 10:1, greater than or equal to about 10.5:1, or greater than or equal to about 11:1. In the semiconductor nanoparticle, a mole ratio of sulfur to indium (S:In) may be less than or equal to about 17:1, less than or equal to about 16.7:1, less than or equal to about 16:1, less than or equal to about 15.5:1, less than or equal to about 15:1, less than or equal to about 14.5:1, less than or equal to about 14:1, less than or equal to about 13.5:1, less than or equal to about 13:1, less than or equal to about 12.5:1, less than or equal to about 12:1, less than or equal to about 11.5:1, less than or equal to about 11.2:1, less than or equal to about 10.5:1, or less than or equal to about 9.8:1.

In the semiconductor nanoparticle, a mole ratio of silver to indium (Ag:In) may be greater than or equal to about 1.1:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, or greater than or equal to about 2.5:1. In the semiconductor nanoparticle, a mole ratio of silver to indium (Ag:In) may be less than or equal to about 5:1, less than or equal to about 4.5:1, less than or equal to about 4:1, less than or equal to about 3.5:1, less than or equal to about 3.3:1, less than or equal to about 3.1:1, less than or equal to about 3:1, less than or equal to about 2.9:1, less than or equal to about 2.8:1, less than or equal to about 2.7:1, or less than or equal to about 2.6:1.

In the semiconductor nanoparticle, a mole ratio of gallium to silver (Ga:Ag) may be greater than or equal to about 1:1, greater than or equal to about 1.1:1, greater than or equal to about 1.15:1, greater than or equal to about 1.18:1, greater than or equal to about 1.2:1, greater than or equal to about 1.25:1, greater than or equal to about 1.3:1, greater than or equal to about 1.33:1, greater than or equal to about 1.37:1, greater than or equal to about 1.4:1, greater than or equal to about 1.43:1, greater than or equal to about 1.45:1, greater than or equal to about 1.5:1, greater than or equal to about 1.55:1, greater than or equal to about 1.6:1, greater than or equal to about 1.65:1, greater than or equal to about 1.7:1, greater than or equal to about 1.75:1, greater than or equal to about 1.8:1, greater than or equal to about 1.85:1, greater than or equal to about 1.9:1, greater than or equal to about 1.95:1, greater than or equal to about 2:1, greater than or equal to about 2.1:1, greater than or equal to about 2.3:1, or greater than or equal to about 2.5:1. In the semiconductor nanoparticle, a mole ratio of gallium to silver (Ga:Ag) may be less than or equal to about 3:1, less than or equal to about 2.8:1, less than or equal to about 2.75:1, less than or equal to about 2.5:1, less than or equal to about 2.2:1, less than or equal to about 2:1, less than or equal to about 1.9:1, less than or equal to about 1.8:1, less than or equal to about 1.75:1, less than or equal to about 1.7:1, less than or equal to about 1.65:1, less than or equal to about 1.6:1, less than or equal to about 1.55:1, less than or equal to about 1.5:1, less than or equal to about 1.45:1, less than or equal to about 1.4:1, or less than or equal to about 1.35:1.

In the semiconductor nanoparticle, a mole ratio of zinc to gallium (Zn:Ga) may be greater than or equal to about 0.6:1, greater than or equal to about 0.65:1, greater than or equal to about 0.7:1, greater than or equal to about 0.75:1, greater than or equal to about 0.78:1, greater than or equal to about 0.8:1, greater than or equal to about 0.82:1, greater than or equal to about 0.85:1, greater than or equal to about 0.9:1, greater than or equal to about 0.95:1, greater than or equal to about 1:1, greater than or equal to about 1.2:1, greater than or equal to about 1.4:1, or greater than or equal to about 1.45:1. In the semiconductor nanoparticle, a mole ratio of zinc to gallium (Zn:Ga) may be less than or equal to about 3.5:1, less than or equal to about 3.3:1, less than or equal to about 2.7:1, less than or equal to about 2.6:1, less than or equal to about 2:1, less than or equal to about 1.6:1, less than or equal to about 1.55:1, less than or equal to about 1.45:1, less than or equal to about 1.3:1, less than or equal to about 1.2:1, less than or equal to about 1.1:1, less than or equal to about 1:1, or less than or equal to about 0.94:1.

In the semiconductor nanoparticle, a mole ratio of gallium to a sum of gallium, indium, and silver (Ga:(Ga+In+Ag)) may be greater than or equal to about 0.3:1, greater than or equal to about 0.35:1, greater than or equal to about 0.4:1, greater than or equal to about 0.45:1, greater than or equal to about 0.46:1, greater than or equal to about 0.47:1, greater than or equal to about 0.48:1, greater than or equal to about 0.49:1, greater than or equal to about 0.5:1, greater than or equal to about 0.51:1, greater than or equal to about 0.52:1, greater than or equal to about 0.53:1, greater than or equal to about 0.54:1, greater than or equal to about 0.55:1, or greater than or equal to about 0.56:1. In the semiconductor nanoparticle, a mole ratio of gallium to a sum of gallium, indium, and silver (Ga:(Ga+In+Ag)) may be less than or equal to about 0.8:1, less than or equal to about 0.7:1, less than or equal to about 0.6:1, less than or equal to about 0.57:1, less than or equal to about 0.54:1, less than or equal to about 0.53:1, less than or equal to about 0.52:1, less than or equal to about 0.51:1, less than or equal to about 0.5:1, less than or equal to about 0.49:1, or less than or equal to about 0.485:1.

In the semiconductor nanoparticle, a mole ratio of a sum of indium and gallium to sulfur ((In+Ga):S) may be greater than or equal to about 0.1:1, greater than or equal to about 0.15:1, greater than or equal to about 0.26:1, greater than or equal to about 0.28:1, greater than or equal to about 0.29:1, greater than or equal to about 0.3:1, greater than or equal to about 0.33:1, greater than or equal to about 0.35:1, greater than or equal to about 0.4:1, greater than or equal to about 0.41:1, greater than or equal to about 0.43:1, greater than or equal to about 0.45:1, greater than or equal to about 0.47:1, or greater than or equal to about 0.5:1. In the semiconductor nanoparticle, a mole ratio of a sum of indium and gallium to sulfur ((In+Ga):S) may be less than or equal to about 0.8:1, less than or equal to about 0.6:1, less than or equal to about 0.55:1, less than or equal to about 0.52:1, less than or equal to about 0.51:1, less than or equal to about 0.5:1, less than or equal to about 0.48:1, or less than or equal to about 0.46:1.

In the semiconductor nanoparticle, a mole ratio of silver to sulfur (Ag:S) may be greater than or equal to about 0.05:1, greater than or equal to about 0.07:1, greater than or equal to about 0.1:1, greater than or equal to about 0.12:1, greater than or equal to about 0.15:1, greater than or equal to about 0.18:1, greater than or equal to about 0.25:1, or greater than or equal to about 0.3:1. In the semiconductor nanoparticle, a mole ratio of silver to sulfur (Ag:S) may be less than or equal to about 0.5:1, less than or equal to about 0.35:1, less than or equal to about 0.33:1, less than or equal to about 0.28:1, less than or equal to about 0.26:1, or less than or equal to about 0.26:1.

In the semiconductor nanoparticle, a mole ratio of zinc to sulfur (Zn:S) may be greater than or equal to about 0.1:1, greater than or equal to about 0.15:1, greater than or equal to about 0.21:1, greater than or equal to about 0.24:1, greater than or equal to about 0.245:1, greater than or equal to about 0.25:1, greater than or equal to about 0.28:1, greater than or equal to about 0.3:1, or greater than or equal to about 0.35:1. In the semiconductor nanoparticle, a mole ratio of zinc to sulfur (Zn:S) may be less than or equal to about 0.8:1, less than or equal to about 0.75:1, less than or equal to about 0.72:1, less than or equal to about 0.7:1, less than or equal to about 0.67:1, less than or equal to about 0.65:1, less than or equal to about 0.6:1, less than or equal to about 0.55:1, less than or equal to about 0.5:1, less than or equal to about 0.49:1, less than or equal to about 0.48:1, less than or equal to about 0.42:1, or less than or equal to about 0.36:1.

In the semiconductor nanoparticle, a mole ratio of gallium to sulfur (Ga:S) may be greater than or equal to about 0.2:1, greater than or equal to about 0.21:1, greater than or equal to about 0.22:1, greater than or equal to about 0.23:1, greater than or equal to about 0.24:1, greater than or equal to about 0.28:1, greater than or equal to about 0.3:1, greater than or equal to about 0.32:1, greater than or equal to about 0.33:1, greater than or equal to about 0.35:1, greater than or equal to about 0.38:1, greater than or equal to about 0.4:1, greater than or equal to about 0.45:1, or greater than or equal to about 0.5:1. In the semiconductor nanoparticle, a mole ratio of gallium to sulfur (Ga:S) may be less than or equal to about 0.6:1, less than or equal to about 0.55:1, less than or equal to about 0.5:1, less than or equal to about 0.46:1, less than or equal to about 0.43:1, less than or equal to about 0.38:1, or less than or equal to about 0.32:1.

In the semiconductor nanoparticle, a mole ratio of indium to sulfur (In:S) may be greater than or equal to about 0.05:1, greater than or equal to about 0.06:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1. In the semiconductor nanoparticle, a mole ratio of indium to sulfur (In:S) may be less than or equal to about 0.3:1, less than or equal to about 0.25:1, less than or equal to about 0.18:1, less than or equal to about 0.16:1, less than or equal to about 0.11:1, less than or equal to about 0.07:1, or less than or equal to about 0.03:1.

In the semiconductor nanoparticle, a mole ratio of silver to a sum of silver, indium, and gallium (Ag:(Ag+In+Ga)) may be greater than or equal to about 0.1:1, greater than or equal to about 0.15:1, greater than or equal to about 0.2:1, greater than or equal to about 0.23:1, greater than or equal to about 0.27:1, greater than or equal to about 0.28:1, greater than or equal to about 0.29:1, greater than or equal to about 0.3:1, greater than or equal to about 0.32:1, greater than or equal to about 0.35:1, greater than or equal to about 0.37:1, or greater than or equal to about 0.39:1. In the semiconductor nanoparticle, a mole ratio of silver to a sum of silver, indium, and gallium (Ag:(Ag+In+Ga)) may be less than or equal to about 및 0.5:1, less than or equal to about 0.4:1, less than or equal to about 0.39:1, less than or equal to about 0.38:1, less than or equal to about 0.37:1, less than or equal to about 0.36:1, less than or equal to about 0.33:1, less than or equal to about 0.32:1, or less than or equal to about 0.28:1.

In the semiconductor nanoparticle, a mole ratio of sulfur to a sum of silver, indium, and gallium (S:(Ag+In+Ga)) may be greater than or equal to about 1:1, greater than or equal to about 1.1:1, greater than or equal to about 1.15:1, greater than or equal to about 1.2:1, greater than or equal to about 1.25:1, greater than or equal to about 1.3:1, greater than or equal to about 1.35:1, greater than or equal to about 1.4:1, greater than or equal to about 1.45:1, greater than or equal to about 1.47:1, greater than or equal to about 1.5:1, greater than or equal to about 1.55:1, greater than or equal to about 1.6:1, or greater than or equal to about 1.7:1. In the semiconductor nanoparticle, a mole ratio of sulfur to a sum of silver, indium, and gallium (S:(Ag+In+Ga)) may be less than or equal to about 2.8:1, less than or equal to about 2.75:1, less than or equal to about 2.7:1, less than or equal to about 2.6:1, less than or equal to about 2.5:1, less than or equal to about 2.3:1, less than or equal to about 2.1:1, less than or equal to about 2:1, less than or equal to about 1.9:1, less than or equal to about 1.7:1, less than or equal to about 1.55:1, less than or equal to about 1.5:1, less than or equal to about 1.45:1, less than or equal to about 1.35:1, less than or equal to about 1.2:1, or less than or equal to about 1.15:1.

In the semiconductor nanoparticle, a mole ratio of sulfur to a sum of silver, indium, gallium, and zinc (S:(Ag+In+Ga+Zn)) may be greater than or equal to about 0.75:1, greater than or equal to about 0.8:1, greater than or equal to about 0.82:1, greater than or equal to about 0.84:1, greater than or equal to about 0.86:1, greater than or equal to about 0.9:1, greater than or equal to about 0.95:1, greater than or equal to about 1:1, greater than or equal to about 1.1:1, or greater than or equal to about 1.15:1. In the semiconductor nanoparticle, a mole ratio of sulfur to a sum of silver, indium, gallium, and zinc (S:(Ag+In+Ga+Zn)) may be less than or equal to about 1.4:1, less than or equal to about 1.35:1, less than or equal to about 1.3:1, less than or equal to about 1.27:1, less than or equal to about 1.26:1, less than or equal to about 1.25:1, less than or equal to about 1.24:1, less than or equal to about 1.21:1, less than or equal to about 1.2:1, less than or equal to about 1.15:1, or less than or equal to about 1.1:1.

In the semiconductor nanoparticle, a mole ratio of a sum of indium and gallium to silver ((In+Ga):Ag) may be greater than or equal to about 1.3:1, greater than or equal to about 1.4:1, greater than or equal to about 1.5:1, greater than or equal to about 1.55:1, greater than or equal to about 1.6:1, greater than or equal to about 1.63:1, greater than or equal to about 1.7:1, greater than or equal to about 1.8:1, or greater than or equal to about 2:1. In the semiconductor nanoparticle, a mole ratio of a sum of indium and gallium to silver ((In+Ga):Ag) may be less than or equal to about 3.7:1, less than or equal to about 2.4:1, less than or equal to about 2.37:1, less than or equal to about 2.3:1, less than or equal to about 2:1, or less than or equal to about 1.9:1.

In an embodiment, the semiconductor nanoparticle may have a charge balance value represented by Equation 2 that is greater than or equal to about 0.8, greater than or equal to about 0.85, greater than or equal to about 0.9, greater than or equal to about 0.91, greater than or equal to about 0.92, greater than or equal to about 0.93, greater than or equal to about 0.95, greater than or equal to about 0.98, greater than or equal to about 0.99, greater than or equal to about 1.02, or greater than or equal to about 1.06. The semiconductor nanoparticle may have a charge balance value represented by Equation 2 that is less than or equal to about 1.4, less than or equal to about 1.35, less than or equal to about 1.3, less than or equal to about 1.25, less than or equal to about 1.2, less than or equal to about 1.18, less than or equal to about 1.17, less than or equal to about 1.15, less than or equal to about 1.1, less than or equal to about 1.05, or less than or equal to about 1:

$$\text{charge balance value} = \{[Ag] + 3([In] + [Ga]) + 2[Zn]\}/(2[S]) \quad \text{Equation 2}$$

wherein, in Equation 2, [Ag], [In], [Ga], [Zn], and [S] are molar amounts of silver, indium, gallium, zinc, and sulfur in the semiconductor nanoparticle, respectively.

The semiconductor nanoparticle may include a first particle containing silver, indium, gallium, and sulfur and a semiconductor nanocrystal layer disposed on the first particle and containing zinc and sulfur. The first particle (e.g., a particle including the first semiconductor nanocrystal and the second semiconductor nanocrystal) may have a charge balance value of 0.8 to 1.3, 0.9 to 1.2, 1 to 1.1, or any combination of low and high values listed.

The first particle may include a first semiconductor nanocrystal (or a core including the same) and optionally a second semiconductor nanocrystal (or a shell including the same). In the semiconductor nanoparticle, the second semiconductor nanocrystal may be disposed on the first semiconductor nanocrystal or may surround or cover at least a portion of the first semiconductor nanocrystal.

The first semiconductor nanocrystal may include silver, indium, gallium, and sulfur. The first semiconductor nanocrystal or the first particle may not include zinc. The second semiconductor nanocrystal may include gallium, sulfur, and, depending on selection, silver. The second semiconductor nanocrystal may have a composition different from that of the first semiconductor nanocrystal and the third semiconductor nanocrystal. The third semiconductor nanocrystal may include a zinc sulfide. The third semiconductor nanocrystal may have a composition different from that of the first semiconductor nanocrystal.

In the semiconductor nanoparticle, a concentration of indium may vary or may differ in a radial direction, i.e., the indium may have a gradient concentration in a radial direction. In the semiconductor nanoparticle, the indium content of an inner portion (e.g., a core) of the particle may be different from an outer part (e.g., a shell layer) of the particle. In an embodiment, the indium content in a portion proximate to the surface (e.g., an outermost layer or shell) may be less than the indium content in the inner portion (or a core) of the particle. In an example, the zinc content (concentration) in a portion proximate to the surface (e.g., the outermost layer) of the particle may be greater than the zinc content (concentration) in the inner portion (or core) of the particle.

The core or the first semiconductor nanocrystal may not include zinc. In the nanoparticle, the zinc content in the portion proximate to the surface of the particle may be greater than the zinc content in the center (e.g., core) of the particle. In the nanoparticle, the concentration of zinc may be greater outside than inside the particle.

The first semiconductor nanocrystal may include silver, a Group 13 metal (e.g., indium, gallium, or a combination thereof), and a chalcogen element (e.g., sulfur, and optionally selenium). The first semiconductor nanocrystal may include a quaternary alloy semiconductor material based on a Group 11-13-16 compound including silver (Ag), indium, gallium, and sulfur. The first semiconductor nanocrystal may include silver indium gallium sulfide, e.g., $Ag(In_xGa_{1-x})S_2$ (x is greater than 0 and less than 1). The mole ratios between the components in the first semiconductor nanocrystal may be adjusted so that the final semiconductor nanoparticle may have a desired composition and an optical property (e.g., a maximum emission wavelength).

The second semiconductor nanocrystal may include a Group 13 metal (indium, gallium, or a combination thereof), and a chalcogen element (sulfur, and optionally selenium). The second semiconductor nanocrystal may further include silver (Ag). The second semiconductor nanocrystal may include silver, gallium, and sulfur. The second semiconductor nanocrystal may include a ternary alloy semiconductor material including silver, gallium, and sulfur. The second semiconductor nanocrystal may have a different composition from that of the first semiconductor nanocrystal. The second semiconductor nanocrystal may include a Group 13-16 compound, a Group 11-13-16 compound, or a combination thereof. The Group 13-16 compound may include a gallium sulfide, a gallium selenide, an indium sulfide, an indium selenide, an indium gallium sulfide, an indium gallium selenide, an indium gallium selenide sulfide, or a combination thereof.

An energy bandgap of the second semiconductor nanocrystal may be different from that of the first semiconductor nanocrystal. An energy bandgap of the second semiconductor nanocrystal may be greater than an energy bandgap of the first semiconductor nanocrystal. An energy bandgap of the second semiconductor nanocrystal may be less than an energy bandgap of the first semiconductor nanocrystal. The molar ratios between each element component in the second semiconductor nanocrystal may be adjusted so that the final semiconductor nanoparticle exhibits a desired composition and optical properties.

The semiconductor nanocrystal layer may include a third semiconductor nanocrystal including (e.g., a zinc sulfide including) zinc and sulfur. The semiconductor nanocrystal layer may surround the first particle. In the semiconductor nanoparticle, the second semiconductor nanocrystal may be disposed between the first semiconductor nanocrystal and the semiconductor nanocrystal layer. The semiconductor nanocrystal layer may be the outermost layer of the semiconductor nanoparticle.

A size (or an average size, hereinafter, can be simply referred to as "size") of the first semiconductor nanocrystal may be greater than or equal to about 0.5 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The size of the first semiconductor nanocrystal may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness (or an average thickness, hereinafter, simply referred to as "thickness") of the second semiconductor nanocrystal may be greater than or equal to about 0.1 nm, greater than or equal to about 0.3 nm, greater than or equal to about 0.5 nm, greater than or equal to about 0.7 nm, or greater than or equal to about 0.9 nm. The thickness of the second semiconductor nanocrystal may be less than or equal to about 1.5 nm, less than or equal to about 1 nm, or less than or equal to about 0.8 nm.

The thickness of the semiconductor nanocrystal layer may be greater than or equal to about 0.1 nm, greater than or equal to about 0.3 nm, greater than or equal to about 0.4 nm or more to 0.5 nm, greater than or equal to about 0.8 nm, greater than or equal to about 1.1 nm, greater than or equal to about 1.3 nm, or greater than or equal to about or 1.6 nm. The thickness of the semiconductor nanocrystal layer may be less than or equal to about 3 nm, less than or equal to about 1.5 nm, less than or equal to about 1 nm, or less than or equal to about or 0.8 nm or less. The thickness of the semiconductor nanocrystal layer may be from about 0.1 nm to 5 nm, from about 0.3 nm to 4 nm, from about 0.5 nm to 3.5 nm, from about 0.7 nm to 3 nm, from about 0.9 nm to 2.5 nm, from about 1 nm to 2 nm, from about 1.5 nm to 1.7 nm, or a combination thereof.

In an embodiment, the semiconductor nanoparticle may include or may not contain lithium. The semiconductor nanoparticles may include or may not contain alkali metals such as sodium, potassium, or the like.

A size (or an average size, hereinafter, simply referred to as "size") of the semiconductor nanoparticle may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, or greater than or equal to about 10.5 nm. The size of the semiconductor nanoparticle may be less than or equal to about 50 nm, less than or equal to about 48 nm, less than or equal to about 46 nm, less than or equal to about 44 nm, less than or equal to about 42 nm, less than or equal to about 40 nm, less than or equal to about 35 nm, less than or equal to about 30 nm, less than or equal to about 25 nm, less than or equal to about 20 nm, less than or equal to about 18 nm, less than or equal to about 16 nm, less than or equal to about 14 nm, less than or equal to about 12 nm, less than or equal to about 11 nm, less than or equal to about 10 nm, less than or equal to about 8 nm, less than or equal to about 6 nm, or less than or equal to about 4 nm.

As used herein, the size of the semiconductor nanoparticle may be a particle diameter. The size of the semiconductor nanoparticle may be an equivalent diameter thereof that is obtained by a calculation involving a conversion of a two-dimensional area of a transmission electron microscopy image of a given particle into a circle. The particle size may be a value (e.g., a nominal particle size) calculated from a composition and a peak emission wavelength of the semiconductor nanoparticle.

A peak emission wavelength of the green light or a peak emission wavelength of the semiconductor nanoparticle may be greater than or equal to about 500 nm, greater than or equal to about 505 nm, greater than or equal to about 510 nm, greater than or equal to about 515 nm, greater than or equal to about 520 nm, greater than or equal to about 525 nm, greater than or equal to about 530 nm, greater than or equal to about 535 nm, greater than or equal to about 540 nm, or greater than or equal to about 545 nm. The peak emission wavelength of the green light or the peak emission wavelength of the semiconductor nanoparticle may be less than or equal to about 580 nm, less than or equal to about 575 nm, less than or equal to about 570 nm, less than or equal to about 565 nm, less than or equal to about 560 nm, less than or equal to about 555 nm, less than or equal to about 550 nm, less than or equal to about 545 nm, less than or equal to about 540 nm, less than or equal to about 535 nm, less than or equal to about 530 nm, less than or equal to about 525 nm, less than or equal to about 520 nm, or less than or equal to about 515 nm.

The peak emission wavelength of the red light or the peak emission wavelength of the semiconductor nanoparticles may range from 600 nm to 660 nm, 605 nm to 650 nm, 610 nm to 645 nm, 615 nm to 640 nm, 620 nm to 635 nm, 623 nm to 632 nm, 625 nm to 630 nm, 628 nm to 629 nm, or a combination thereof.

The semiconductor nanoparticle may exhibit a quantum yield of greater than or equal to about 50%. The quantum yield may be an absolute quantum yield. The quantum yield may be greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%. The quantum yield may be less than or equal to about 100%, less than or equal to about 99.5%, less than or equal to about 99%, less than or equal to about 98%, or less than or equal to about 97%.

A full width at half maximum (FWHM) of the first light (e.g., the green light or the red light) or a FWHM of the semiconductor nanoparticle may be greater than or equal to about 5 nm, greater than or equal to about 10 nm, greater than or equal to about 15 nm, greater than or equal to about 20 nm, greater than or equal to about 25 nm, or greater than or equal to about 30 nm. The full width at half maximum may be less than or equal to about 90 nm, less than or equal to about 85 nm, less than or equal to about 80 nm, less than or equal to about 75 nm, less than or equal to about less than or equal to about 70 nm, less than or equal to about 65 nm, less than or equal to about 60 nm, less than or equal to about 55 nm, less than or equal to about 50 nm, less than or equal to about 45 nm, less than or equal to about 40 nm, less than or equal to about 38 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

In an embodiment, the semiconductor nanocrystal layer may contribute to improving stability of the semiconductor nanoparticles. The first particle based on the Group 11-13-16 compound may exhibit a relatively improved luminescent efficiency and a narrow full width at half maximum. However, the present inventors have found that the light-emitting properties of the first particle may rapidly decrease during a process of for example manufacturing a composite, and it is difficult to avoid a further decrease in light-emitting properties when it is exposed to an external environment (e.g., $O_2$ or moisture in the atmosphere) even in a form of a composite. The semiconductor nanoparticle according to an embodiment may exhibit an improved process maintenance ratio, for example, in terms of a luminescent efficiency during a composite manufacturing process, and the manufactured composite may exhibit improved stability against an external environment.

The present inventors have found that forming a zinc chalcogenide-based semiconductor nanocrystal layer on the first particle containing a Group 11-13-16 compound may not avoid an adverse effect in the luminous properties of the first particle. The present inventors have found that when a semiconductor nanocrystal layer is formed by the reaction of zinc and a chalcogen element according to the prior art, the ratio of trap light emission (i.e., an emission peak area exceeding the maximum emission peak wavelength+50 nm) in the emission peak of the final particle is significantly increased. Without wishing to be bound by any theory, it is believed that it may be difficult to form a zinc sulfide-based semiconductor nanocrystal, or that a zinc ion may be exchanged for gallium in the first particle or may diffuse into the first particles, resulting in an increase in trap light emission in the final semiconductor nanoparticle. The semiconductor nanoparticle of an embodiment may be manufactured according to the method described herein, for example, and exhibit increased stability together with a trap light emission that is remarkably suppressed.

In an embodiment, the first light (the green light or the red light) may include band-edge emission. In an embodiment, the light emitted by the semiconductor nanoparticle may further include a defect site emission or a trap emission. The band-edge emission may be centered at a higher energy (a lower wavelength) with a smaller offset from the absorption onset energy compared to the trap emission. The band-edge emission may have a narrower wavelength distribution than the trap emission. The band-edge emission may have a normal (e.g., Gaussian) wavelength distribution.

In the photoluminescence spectrum of the semiconductor nanoparticle, a percentage of the trap light emission area (Trap) (e.g., the emission peak area exceeding the emission peak wavelength+50 nm) with respect to a total emission peak area (A) may be less than or equal to about 25%, less than or equal to about 24%, less than or equal to about 23%, less than or equal to about 22%, less than or equal to about 21%, less than or equal to about 20%, less than or equal to about 15%, less than or equal to about 12%, less than or equal to about 10%, less than or equal to about 9%, less than or equal to about 8%, less than or equal to about 7%, less than or equal to about 5%, less than or equal to about 4%, less than or equal to about or 2% or less:

$$\text{Trap emission percentage (\%)} = [\text{Trap}/A] \times 100$$

In the above equation, Trap is the area of trap light emission

A is the total area of the emission spectrum, see FIG. 1

The present inventors have found that there is a limit to suppressing and removing trap light emission in a Group 13-16 compound-based semiconductor nanoparticle containing silver. Providing a zinc chalcogenide layer may increase the stability of the semiconductor nanoparticles, but it can also increase the trap light emission of the final particle. By having the structure/composition described herein, the semiconductor nanoparticle of an embodiment may exhibit a light emission spectrum in which trap light emission is substantially suppressed or removed.

In an embodiment, a method of manufacturing a semiconductor nanoparticle includes reacting a zinc precursor with a sulfur precursor in the presence of a first particle containing indium, gallium, silver, and sulfur to form a semiconductor nanocrystal layer containing zinc and sulfur on the first particle. The reaction includes adding the first particle and the zinc precursor to a reaction medium including the sulfur precursor and a first organic solvent. The reaction is conducted at a temperature of greater than 180° C. and less than about 240° C.

Details of the semiconductor nanoparticle and the first particle are the same as described herein.

The reaction medium may be heated to a predetermined temperature under vacuum before the first particle and/or the zinc precursor is added, for example, to a temperature of greater than or equal to about 80° C., greater than or equal to about 100° C., greater than or equal to about 120° C., greater than or equal to about or 200° C., and less than or equal to about or 180° C., less than or equal to about 150° C., or less than or equal to about or 130° C.

The reaction temperature may be greater than or equal to about 203° C., greater than or equal to about 205° C., greater than or equal to about 208° C. or more and less than or equal to about 225° C., less than or equal to about or 215° C. or less. The time for the reaction may be 10 minutes or more, 30 minutes or more, 40 minutes or more, 1 hour or more, 80 minutes or more, or 90 minutes or more and 5 hours or less, 4 hours or less, 3 hours or less, 2 hours or less, 90 minutes or less, or 70 minutes or less.

The first organic solvent may include a substituted or unsubstituted C5 to C40 aliphatic hydrocarbon (e.g., alkane, alkene, alkyne) solvent, a substituted or unsubstituted C6 to C40 aromatic hydrocarbon solvent, a C5 to C40 amine solvent (e.g., an aliphatic amine solvent), a phosphine solvent having a substituted or unsubstituted C5 to C50 aliphatic or aromatic group, or a combination thereof. The C5 to C40 (or C10-C20 or C12-C18) aliphatic hydrocarbon solvent may include octane, heptane, hexane, octadecene, or a combination thereof. The C6 to C40 aromatic hydrocarbon solvent may include toluene, benzene, or the like. The C5 to C40 (or C10-C20 or C12-C18) amine solvent may include an aliphatic amine solvent such as trioctylamine or oleylamine, or an aromatic amine solvent such as triphenylamine. The amine solvent may include a primary amine such as hexyl amine, decylamine, or stearylamine. The first organic solvent may not include a phosphine solvent (which has 1, 2, or 3 aliphatic or aromatic groups) such as trioctyl phosphine.

The first organic solvent may contain a mixture of two or more organic solvents.

The mixture of the organic solvents may be a mixture of a first solvent comprising a C5 to C40 aliphatic hydrocarbon solvent and a second solvent comprising a C5 to C40 amine solvent.

In the mixture of the organic solvent, a mixing ratio between the first organic solvent and the second organic solvent may be from about 1:0.01 to 1:10, 1:0.02 to 1:9.5, 1:0.03 to 1:9, 1:0.04 to 1:8.5, 1:0.05 to 1:8, 1:0.06 to 1:7.5, 1:0.07 to 1:7, 1:0.1 to 1:6, 1:0.15 to 1:5.5, 1:0.2 to 1:5, 1:0.25 to 1:4.5, 1:0.25 to 1:4, 1:0.3 to 1:3, 1:0.4 to 1:2.5, 1:0.5 to 1:2, 1:0.7 to 1:1.5, 1:0.75 to 1:1.3, 1:0.78 to 1:1.28, 1:0.8 to 1:1.25, 1:0.85 to 1:0.99, 1:0.88 to 1:0.96, 1:0.9 to 1:0.95, 1:0.93 to 1:0.94, or a combination thereof. In an embodiment, a content of the first solvent in the organic solvent mixture may be greater than a content of the second solvent.

Surprisingly, the inventors have found that a semiconductor nanoparticle prepared by the process involving the use of such a mixed solvent can exhibit further improved stability (e.g., relative luminescent efficiency when stored in air, as described below), when present in the form of a composite.

The method of adding the first particle and/or the zinc precursor to the reaction medium (e.g., heated) for the formation of the semiconductor nanocrystal layer (e.g., including a zinc chalcogenide) may include a shot addition (e.g., syringe addition), dropwise addition, or a combination thereof.

Surprisingly, the present inventors have found that if a semiconductor nanocrystal layer containing zinc and sulfur is formed on the first particles based on Group 11-13-16 by the method described herein, the final particle can achieve stability with improved luminous properties (e.g., a narrow full width at half maximum, an improved quantum yield (QY), and/or a suppressed trap light emission). Without wishing to be bound by any specific theory, it is thought that in the method described herein, a semiconductor nanocrystal layer containing a zinc sulfide can be formed without a substantial change (e.g., a decrease in gallium content) in the components of the first particles. In addition, the present inventors have found that the zinc-sulfur-containing semiconductor nanocrystal layer formed in this way can also contribute to the improvement of the thermal stability and atmospheric stability of the final semiconductor nanoparticle.

In an embodiment, the preparation of the first particles may involve a method that includes: preparing a reaction medium containing a first precursor in a second organic solvent; heating the reaction medium to a first temperature; and adding the first semiconductor nanocrystal and the second precursor to the reaction medium to obtain a reaction mixture, one of the first precursor and the second being a gallium precursor and the other being a sulfur precursor. The reaction medium is heated to a second temperature and the reaction proceeds for a first time to form a first particle.

The first temperature may be greater than or equal to about 120° C. or more (e.g., greater than or equal to about 180° C., greater than or equal to about 190° C., or greater than or equal to about 200° C.) and 280° C. or less (e.g., 250° C. or less), the second temperature may be greater than or equal to about 190° C., greater than or equal to about or 240° C. or more and less than or equal to about 380° C., or less than or equal to about 280° C. or less. The first reaction time may be controlled so that the first particles can obtain the charge balance value described herein.

The second organic solvent may include a substituted or unsubstituted C5 to C40 aliphatic hydrocarbon solvent (e.g., octadecene), a substituted or unsubstituted C6 to C40 aromatic hydrocarbon solvent (toluene, etc.), a C5 to C40 amine solvent (e.g., an aliphatic amine solvent such as trioctylamine, oleylamine, etc.), or a combination thereof. The second organic solvent may include a mixture of two or more organic solvents (e.g., a mixture of an aliphatic hydrocarbon solvent and an aliphatic amine solvent). The second organic solvent may be the same as the first organic solvent. The second organic solvent may be different from the first organic solvent.

The details of the first semiconductor nanocrystal, the second semiconductor nanocrystal, and the charge balance value are the same as described herein. The first temperature and the second temperature may be different. The second temperature may be higher than the first temperature.

In one or more embodiments, the first precursor may be a sulfur precursor, and the second precursor may be a gallium precursor. According to the method of one or more embodiments, oxidation of the gallium precursor may be suppressed efficiently.

In an embodiment, the prepared first particle can be separated and optionally washed. Separation and washing can be performed by the manner described herein.

The detailed description of the first semiconductor nanocrystal is the same as described herein. The first semiconductor nanocrystal may include silver (Ag), indium, gallium, and sulfur. A method of producing the first semiconductor nanocrystal is not particularly limited and may be appropriately selected. In one or more embodiments, the first semiconductor nanocrystal may be obtained by reacting the required precursors depending on the composition such as a silver precursor, an indium precursor, a gallium precursor, and a sulfur precursor in a solution including an organic ligand and an organic solvent at a predetermined reaction temperature (e.g., about 180° C. to about 300° C. or about 200° C. to about 280° C.), and separating the same. For separation and recovery, a method to be described herein may be referred to.

The second temperature may be higher than the first temperature. A difference between the first temperature and the second temperature may be greater than or equal to about 10° C., greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The difference between the first temperature and the second temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., or less than or equal to about 20° C.

The first temperature may be greater than or equal to about 120° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 280° C., less than or equal to about 275° C., less than or equal to about 270° C., less than or equal to about 265° C., less than or equal to about 260° C., less than or equal to about 255° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., or less than or equal to about 150° C.

The second temperature may be greater than or equal to about 240° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 330° C., greater than or equal to about 335° C., greater than or equal to about 340° C., or greater than or equal to about 345° C. The second temperature may be less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C.

The first reaction time may be controlled to obtain a charge balance value of the first particle. The present inventors have found that by controlling the first temperature and the second temperature and the first reaction time in the aforementioned reaction, generation of side reaction products (e.g., gallium oxide) may be effectively suppressed during the formation of semiconductor nanoparticles, and whereby the first particle may have the charge balance value described herein (optionally, together with the molar ratios between each component described herein), which may contribute to achieving the properties of the semiconductor nanoparticle as described herein.

In one or more embodiments, the first reaction time may be from about 10 minutes to about 3 hours, from about 20 minutes to about 150 minutes, from about 30 minutes to about 100 minutes, or a combination thereof. The first reaction time may be selected in consideration of the types of precursors, the reaction temperature, the desired composition of the final particles, or the like. In one or more embodiments, the second reaction temperature may be within a relatively high temperature range (e.g., greater than or equal to about 280° C., about 285° C. to about 340° C., or about 290° C. to about 330° C.), and the first reaction time may be greater than or equal to about 10 minutes, greater than or equal to about 15 minutes, greater than or equal to about 20 minutes, or greater than or equal to about 25 minutes to less than or equal to about 2 hours, less than or equal to about 90 minutes, less than or equal to about 80 minutes, less than or equal to about 70 minutes, less than or equal to about 60 minutes, less than or equal to about 50 minutes, less than or equal to about 45 minutes, less than or equal to about 40 minutes, or less than or equal to about 35 minutes. In one or more embodiments, the second reaction temperature may be within a relatively low temperature range (e.g., less than about 290° C.) and the first reaction time may be greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, greater than or equal to about 60 minutes, greater than or equal to about 65 minutes, greater than or equal to about 70 minutes, greater than or equal to about 75 minutes, or greater than or equal to about 80 minutes.

A type of silver precursor is not particularly limited, and may be selected appropriately. The silver precursor may include a silver powder, an alkylated silver compound, a silver alkoxide, a silver carboxylate, a silver acetylacetonate, a silver nitrate, a silver sulfate, a silver halide, a silver cyanide, a silver hydroxide, a silver oxide, a silver peroxide, a silver carbonate, or a combination thereof. The silver precursor may include a silver nitrate, a silver acetate, a silver acetylacetonate, or a combination thereof.

A type of indium precursor is not particularly limited and may be selected appropriately. The indium precursor may include an indium powder, an alkylated indium compound, an indium alkoxide, an indium carboxylate, an indium nitrate, an indium perchlorate, an indium sulfate, an indium acetylacetonate, an indium halide, an indium cyanide, an indium hydroxide, an indium oxide, an indium peroxide, an indium carbonate, or a combination thereof. The indium precursor may include an indium carboxylate (such as indium oleate, indium myristate, and an indium acetate), an indium hydroxide, indium chloride, indium bromide, indium iodide, or a combination thereof.

A type of gallium precursor is not particularly limited and may be appropriately selected. The gallium precursor may include a gallium powder, an alkylated gallium compound, a gallium alkoxide, a gallium carboxylate, a gallium nitrate, a gallium perchlorate, a gallium sulfate, a gallium acetylacetonate, a gallium halide, a gallium cyanide, a gallium hydroxide, a gallium oxide, a gallium peroxide, a gallium carbonate, or a combination thereof. The gallium precursor may include gallium chloride, gallium iodide, gallium bromide, a gallium acetate, a gallium acetylacetonate, gallium oleate, gallium palmitate, gallium stearate, gallium myristate, a gallium hydroxide, or a combination thereof.

A type of sulfur precursor is not particularly limited and may be appropriately selected. The sulfur precursor may be an organic solvent dispersion or a reaction product of sulfur and an organic solvent (for example, a octadecene sulfide (S-ODE), a trioctylphosphine-sulfide (S-TOP), a tributylphosphine-sulfide (S-TBP), a triphenylphosphine-sulfide (S-TPP), a trioctylamine-sulfide (S-TOA)), a trimethylsilylalkyl sulfide, a trimethylsilyl sulfide, a mercapto propyl silane, an ammonium sulfide, a sodium sulfide, a C1-30 thiol compound (e.g., α-toluene thiol, octane thiol, dodecanethiol, octadecene thiol, or the like), an isothiocyanate compound (e.g., cyclohexylisothiocyanate, or the like), alkylenetrithiocarbonate (e.g., ethylene trithiocarbonate or the like), allyl mercaptan, a thiourea compound (e.g., dialkylthiourea having a C1 to C40 alkyl group such as dimethylthiourea, diethyl thiourea, ethyl methyl thiourea, dipropyl thiourea, or the like), a thioacetamide compound, or a combination thereof.

The selenium precursor, if present, may include selenium-trioctylphosphine (Se-TOP), selenium-tributylphosphine (Se-TBP), selenium-triphenylphosphine (Se-TPP), or a combination thereof.

A type of zinc precursor is not particularly limited and may be appropriately selected. In one or more embodiments, the zinc precursor may include a Zn metal powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof. In an embodiment, when the semiconductor nanocrystal layer containing zinc and sulfur is formed, the zinc precursor may include Zn halide, but is not limited thereto.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO $(OH)_2$, RHPOOH, $R_2POOH$ (wherein, R and R' are each independently substituted or unsubstituted $C_1$ to C40 (or C3 to C24) aliphatic hydrocarbon group (e.g., an alkyl group, an alkenyl group, or an alkynyl group), or a substituted or unsubstituted C6 to C40 (or C6 to C24) aromatic hydrocarbon group (e.g., a C6 to C20 aryl group)), or a combination thereof. The organic ligand may be bound to the surface of the semiconductor nanoparticle. Examples of the organic ligand may include methane thiol, ethane thiol, propane thiol, butane thiol, pentane thiol, hexane thiol, heptane thiol, octane thiol, 1-nonanethiol, decanethiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; substituted or unsubstituted methyl phosphine (e.g., trimethyl phosphine, methyldiphenyl phosphine, or the like), substituted or unsubstituted ethyl phosphine (e.g., triethyl phosphine, ethyldiphenyl phosphine, or the like), substituted or unsubstituted propyl phosphine, substituted or unsubstituted butyl phosphine, substituted or unsubstituted pentyl phosphine, substituted or unsubstituted octylphosphine (e.g., trioctylphosphine (TOP) or the like); a phosphine oxide such as substituted or unsubstituted methyl phosphine oxide (e.g., trimethyl phosphine oxide, methyldiphenyl phosphine oxide, or the like), substituted or unsubstituted ethyl phosphine oxide (e.g., triethyl phosphine oxide, ethyldiphenyl phosphine oxide, or the like), substituted or unsubstituted propyl phosphine oxide, substituted or unsubstituted butyl phosphine oxide, substituted or unsubstituted octylphosphine oxide (e.g., trioctylphosphine oxide (TOPO), or the like); diphenyl phosphine, a triphenyl phosphine compound, or an oxide compound thereof; phosphonic acid; a C5 to C20 alkyl phosphonic acid; a C5 to C20 alkylphosphinic acid such as hexylphosphinic acid, octylphosphinic acid, dodecanephosphinic acid, tetradecanephosphinic acid, hexadecanephosphinic acid, octadecanephosphinic acid, or the like, but embodiments are not limited thereto. The organic ligand may be used alone or as a mixture of two or more.

The first organic solvent or the second organic solvent, or the organic solvent may include an amine solvent (e.g., a C1-50 aliphatic amine), a nitrogen-containing heterocyclic compound such as pyridine; a C6 to C40 aliphatic hydrocarbon (e.g., alkane, alkene, alkyne, or the like) such as hexadecane, octadecane, octadecene, squalene, or the like; a C6 to C30 aromatic hydrocarbon such as phenyldodecane, phenyltetradecane, phenyl hexadecane, or the like; a phosphine substituted with a C6 to C22 alkyl group such as trioctylphosphine or the like; a phosphine oxide substituted with a C6 to C22 alkyl group such as trioctylphosphine oxide, or the like; a C12 to C22 aromatic ether such as a phenyl ether, a benzyl ether, or the like; or a combination thereof. The amine solvent may be a compound having one or more (e.g., two or three) C1-50, C2-45, C3-40, C4-35, C5-30, C6-25, C7-20, C8-15, or C6-22 aliphatic hydrocarbon groups (e.g., alkyl group, alkenyl group, or alkynyl group). In one or more embodiments, the amine solvent may be a C6-22 primary amine such as hexadecyl amine, oleylamine, or the like; a C6-22 secondary amine such as dioctyl amine or the like; a C6-22 tertiary amine such as trioctylamine or the like; or a combination thereof.

Amounts of the organic ligand and the precursors in the reaction medium may be selected appropriately in consideration of the type of solvent, the type of the organic ligand and each precursor, and the size and composition of desired nanoparticles. Mole ratios between the precursors may be changed taking into consideration the desired mole ratios in the final nanoparticle, the reactivities among the precursors, or the like. In one or more embodiments, a manner of adding each of the precursors is not particularly limited. In one or more embodiments, a total or complete amount of a precursor may be added at one time. In one or more embodiments, a total amount of a precursor may be divided and added into greater than or equal to about 2 aliquots and less than or equal to about 10 aliquots. The precursors may be added simultaneously or sequentially in a predetermined order. The reaction may be carried out in an inert gas atmosphere, in air, or in a vacuum state, but is not limited thereto.

When a nonsolvent is added to the final reaction solution after completion of the reaction, (e.g., the organic ligand is coordinated) nanoparticles may be separated (e.g., precipitated). The nonsolvent may be a polar solvent that is miscible with the solvent used in the reaction but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed by centrifugation, precipitation, chromatography, or distillation. Separated nanocrystals may be washed by adding to a washing solvent as needed. The washing solvent is not particularly limited, and a solvent having a solubility parameter similar to that of the organic solvent or ligand may be used. The nonsolvent or washing solvent may be alcohols; alkane solvents such as hexane, heptane, octane, or the like; aromatic solvents such as toluene, benzene, or the like; halogenated solvent such as chloroform or the like; or a combination thereof, but is not limited thereto.

The semiconductor nanoparticle thus prepared may be dispersed in a dispersion solvent. The semiconductor nanoparticle thus prepared may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted $C_1$ to C40 aliphatic hydrocarbon, a substituted or unsubstituted C6 to C40 aromatic hydrocarbon, or a combination thereof.

A shape of the semiconductor nanoparticle thus prepared is not particularly limited, and may include, for example, spherical, polyhedral, pyramidal, multipod, cubic, nanotubes, nanowires, nanofibers, nanosheets, or a combination thereof, but is not limited thereto.

The semiconductor nanoparticle of an embodiment may include an organic ligand and/or an organic solvent on a surface of the semiconductor nanoparticle. The organic ligand and/or the organic solvent may be bound to a surface of the semiconductor nanoparticle of one or more embodiments.

In one or more embodiments, a composite may include a matrix; and the semiconductor nanoparticle described herein, wherein the semiconductor nanoparticle may be dispersed in the matrix. The composite may further contain a metal oxide fine particle. The composite may be configured to emit green light. In an embodiment, the composite may be in the form of a patterned film. The composite may further include a semiconductor nanoparticle configured to emit second light different from the green light. In an embodiment, the composite may have a sheet form. The sheet may further include a semiconductor nanoparticle (e.g., an additional semiconductor nanoparticle) configured to emit second light different from the green light.

The semiconductor nanoparticle described herein or the composite including the semiconductor nanoparticle may exhibit an increased level of blue light absorbance (e.g., an improved incident light absorbance) and/or improved optical properties (e.g., an increased luminescent efficiency and a narrower full width at half maximum), and may emit light of a desired wavelength (e.g., first light).

In a color conversion panel of one or more embodiments, the first composite may exhibit an increased level of blue light absorbance (e.g., an improved excitation light absorbance) and improved optical properties (e.g., an increased luminescent efficiency and a narrowed full width at half maximum) and may emit light of a desired wavelength (e.g., a first light). In the color conversion panel of one or more embodiments, the composite may be in the form of a patterned film. In another embodiment, the composite may have a sheet form.

The composite may include the semiconductor nanoparticle or a population thereof (e.g., in a predetermined amount) and exhibit increased light absorbance. An incident light absorbance of the composite may be greater than or equal to about 70%, greater than or equal to about 73%, greater than or equal to about 75%, greater than or equal to about 77%, greater than or equal to about 80%, greater than or equal to about 83%, greater than or equal to about 85%, greater than or equal to about 87%, greater than or equal to about 90%, greater than or equal to about 93%, greater than or equal to about 94%, greater than or equal to about 95%, greater than or equal to about 96%, greater than or equal to about 97%, greater than or equal to about 98%, or greater than or equal to about 99%. The blue light absorbance of the composite may be about 70% to about 100%, about 80% to about 98%, about 95% to about 99%, about 96% to about 98%, or a combination thereof.

The incident light absorbance may be calculated according to Equation 5:

$$\text{incident light absorbance} = [(B - B')/B] \times 100\% \quad \text{Equation 5}$$

wherein, in Equation 5,

B is an amount of incident light provided to the first composite, and

B' is an amount of incident light passing through the composite.

A light conversion efficiency (CE) of the composite may be greater than or equal to about 7%, greater than or equal to about 8%, greater than or equal to about 9%, greater than or equal to about 10%, greater than or equal to about 11%, greater than or equal to about 12%, greater than or equal to about 12.5%, greater than or equal to about 12.9%, greater than or equal to about 13%, greater than or equal to about 14.5%, greater than or equal to about 15%, greater than or equal to about 15.5%, greater than or equal to about 16%, greater than or equal to about 16.5%, greater than or equal to about 16.7%, or greater than or equal to about 16.9%.

The light conversion efficiency is defined by the following equation:

$$\text{Light conversion efficiency } (CE, \%) = [A/(B-B')] \times 100(\%)$$

A: The amount of the first light from the composite

B: The amount of incident light provided to the composite

B': The amount of incident light passing through the composite.

The present inventors have found that the luminescent particle including semiconductor nanocrystals based on Group 11-13-16 compounds even achieving the desired level of optical properties may exhibit significantly reduced properties when being included in the composite for the application in an actual device. The semiconductor nanoparticle of an embodiment can provide a composite exhibiting improved optical properties by having the above-described composition and/or structural features, exhibiting high optical properties even in a form of a film. The semiconductor nanoparticle of an embodiment may exhibit significantly improved stability (e.g., thermal stability and atmospheric stability).

A composite containing a semiconductor nanoparticle of an embodiment may exhibit a process maintenance ratio of greater than or equal to about 30%, greater than or equal to about 45%, greater than or equal to about 60%, greater than or equal to about 65%, or greater than or equal to about 70%, wherein the process maintenance ratio is defined by the following formula:

$$\text{process maintenance ratio} = \{\text{composite film state photoconversion ratio}/\text{quantum yield of the semiconductor nanoparticle in solution}\} \times 2 \times 100\%$$

The process maintenance ratio may be from about 30% to 99%, 68% to 95%, 70% to 85%, or any combination of stated low and high values thereof.

A composite including the semiconductor nanoparticle of an embodiment may exhibit a thermal stability defined by the following equation that is greater than or equal to about 60%, greater than or equal to about 65%, or greater than or equal to about 70%:

$$\text{A thermal stability } (\%) = [\text{A light conversion efficiency of the composite after a } POB \text{ process}/\text{A light conversion efficiency of the composite after a } PRB \text{ process}] \times 100$$

In an embodiment, when the nanoparticles are kept in air for 48 hours (e.g., at room temperature or 25° C.), the composite may exhibit a relative luminescent efficiency (or stability) of greater than or equal to about 55%, greater than or equal to about 60%, greater than or equal to about 65%, greater than or equal to about 68%, or greater than or equal to about or 70% or more:

$$\text{Relative luminescent efficiency } (\%) = [\text{Quantum efficiency after 48 hours of the light emitting film}/\text{initial luminescent efficiency of the light emitting film}] \times 100.$$

In an embodiment, the composite may be prepared from an ink composition. The ink composition may include a liquid vehicle; and a plurality of the semiconductor nanoparticles of one or more embodiments. The semiconductor nanoparticle may be dispersed in the liquid vehicle.

The liquid vehicle may include a liquid monomer, an organic solvent, or a combination thereof. The ink composition may further include metal oxide nanoparticle(s) e.g., dispersed in the liquid vehicle. The ink composition may further include a dispersant (for dispersing the nanoparticles and/or the metal oxide nanoparticles). The dispersant may include a carboxylic acid group-containing organic compound (a monomer or a polymer). The liquid vehicle may not include an (e.g., volatile) organic solvent. The ink composition may be a solvent-free system.

The liquid monomer may include a (photo)polymerizable monomer including a carbon-carbon double bond. The composition may optionally further include a (thermal or photo) initiator. The polymerization of the composition may be initiated by light or heat.

Details of the nanoparticle(s) in the composition (or composite) are as described herein. A content or amount of semiconductor nanoparticles in the composition (or composite) may be appropriately adjusted in consideration of a desired end use (e.g., a color filter, or the like). In one or more embodiments, an amount of the semiconductor nanoparticle in the composition (or composite) may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on the solid content of the composition or composite (hereinafter, the solid content may be a solid content of the composition or a solid content of the composite). The amount of the semiconductor nanoparticle may be less than or equal to about 70 wt %, for example, less than or equal to about 65 wt %, less than or equal to about 60 wt %, less than or equal to about 55 wt %, or less than or equal to about 50 wt %, based on the solid content of the composition or composite. A weight percentage of a given component with respect to a total solid content in a composition may represent an amount of the given component in the composite described herein.

In one or more embodiments, an ink composition may be a semiconductor nanoparticle-containing photoresist composition applicable in a photolithography manner. In one or more embodiments, an ink composition may be a semiconductor nanoparticle-containing composition capable of providing a pattern in a printing manner (e.g., a droplet discharging method such as an inkjet printing). The composition according to one or more embodiments may not include a conjugated (or conductive) polymer (except for a cardo binder to be described herein). The composition according to one or more embodiments may include a conjugated polymer. Herein, the conjugated polymer refers to a polymer (e.g., polyphenylenevinylene, or the like) having a conjugated double bond in the main chain.

In the composition according to one or more embodiments, the dispersant may ensure dispersibility of the nanoparticles. In one or more embodiments, the dispersant may be a binder (or a binder polymer). The binder may include a carboxylic acid group (e.g., in the repeating unit). The binder may be an insulating polymer. The binder may be a carboxylic acid group-containing compound (a monomer or a polymer).

In the composition (or the composite), a content of the dispersant may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total solid content of the composition (or composite). The content of the dispersant may be less than or equal to about 55 wt %, less than or equal to about 35 wt %, less than or equal to about 33 wt %, or less than or equal to about 30 wt %, based on the total solid content.

In the composition (or liquid vehicle), a liquid monomer or a polymerizable (e.g., photopolymerizable) monomer (hereinafter, referred to as a monomer) including the carbon-carbon double bond may include a (e.g., photopolymerizable) (meth)acryl-containing monomer. The monomer may be a precursor for an insulating polymer.

A content of the (photopolymerizable) monomer, based on a total weight of the composition, may be greater than or equal to about 0.5 wt %, for example, greater than or equal to about 1 wt %, greater than or equal to about 2 wt %, greater than or equal to about 3 wt %, greater than or equal to about 5 wt %, or greater than or equal to about 10 wt %. A content of the (photopolymerizable) monomer, based on the total weight of the composition, may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, a content of the initiator may be appropriately adjusted considering types and contents of the polymerizable monomers. In one or more embodiments, the content of the initiator may be greater than or equal to about 0.01 wt %, for example, greater than or equal to about 1 wt %, and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on the total weight of the composition (or the total weight of the solid content), but is not limited thereto.

The composition (or composite) may further include a (multi- or monofunctional) thiol compound having at least one thiol group at the terminal end (or a moiety derived therefrom, such as a moiety produced by a reaction between a thiol and a carbon-carbon double bond, for example, a sulfide group), metal oxide particulate, or a combination thereof.

The metal oxide particulates may include $TiO_2$, $SiO_2$, $BaTiO_3$, $Ba_2TiO_4$, ZnO, or a combination thereof. In the composition (or composite), a content of the metal oxide particulates may be greater than or equal to about 1 wt %, greater than or equal to about 2 wt %, greater than or equal to about 3 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 7 wt %, less than or equal to about 5 wt %, or less than or equal to about 3 wt %, based on the total solid content.

A diameter of the metal oxide particulates is not particularly limited, and may be appropriately selected. The diameter of the metal oxide particulates may be greater than or equal to about 100 nm, for example greater than or equal to about 150 nm, or greater than or equal to about 200 nm and less than or equal to about 1000 nm, or less than or equal to about 800 nm.

The multithiol compound may be a dithiol compound, a trithiol compound, a tetrathiol compound, or a combination thereof. For example, the thiol compound may be ethylene glycol bis(3-mercaptopropionate), ethylene glycol dimercapto acetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the thiol compound (or moieties derived therefrom) may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on the total solid content. The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 18 wt %, or greater than or equal to about 20 wt %, based on the total solid content.

The composition or the liquid vehicle may include an organic solvent. In some embodiments, the composition or the liquid vehicle may not include an organic solvent. If present, the type of organic solvent that may be used is not particularly limited. The type and amount of the organic solvent is appropriately determined in consideration of the types and amounts of the aforementioned main components (i.e., nanoparticles, dispersants, polymerizable monomers, initiators, thiol compounds, or the like, if present) and other additives to be described herein. The composition may include a solvent in a residual amount except for a desired content of the (non-volatile) solid. In one or more embodiments, examples of the organic solvent may be an ethylene glycols such as ethylene glycol, diethylene glycol, polyethylene glycol, and the like; a glycol ether solvent such as ethylene glycol monomethylether, ethylene glycol monoethyl ether, diethylene glycol monomethyl ether, ethylene glycol diethyl ether, diethylene glycol dimethyl ether, or the like; a glycol ether acetate solvent such as ethylene glycol acetate, ethylene glycol monoethyl ether acetate, diethylene glycol monoethyl ether acetate, diethylene glycol monobutyl ether acetate, or the like; a propylene glycol solvent such as propylene glycol, or the like; a propylene glycol ether solvent such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, dipropylene glycol diethyl ether, or the like; a propylene glycol ether acetate solvent such as propylene glycol monomethyl ether acetate, dipropylene glycol monoethyl ether acetate, or the like; an amide solvent such as N-methylpyrrolidone, dimethyl formamide, dimethyl acetamide, or the like; a ketone solvent such as methylethylketone (MEK), methylisobutylketone (MIBK), cyclohexanone, or the like; a petroleum solvent such as toluene, xylene, solvent naphtha, or the like; an ester solvent such as ethyl acetate, butyl acetate, ethyl lactate, ethyl 3-ethoxy propionate, or the like; an ether solvent such as diethyl ether, dipropyl ether, dibutyl ether, or the like; chloroform, a C1 to C40 aliphatic hydrocarbon solvent (e.g., alkane, alkene, or alkyne), a halogen (e.g., chloro) substituted $C_1$ to C40 aliphatic hydrocarbon solvent (e.g., dichloroethane, trichloromethane, or the like), a C6 to C40 aromatic hydrocarbon solvent (e.g., toluene, xylene, or the like), a halogen (e.g., chloro) substituted C6 to C40 aromatic hydrocarbon solvent; or a combination thereof.

In addition to the aforementioned components, the composition (or composite) of one or more embodiments may further include an additive such as a light diffusing agent, a leveling agent, a coupling agent, or a combination thereof. Components (binder, monomer, solvent, additives, thiol compound, cardo binder, or the like) included in the composition of one or more embodiments may be appropriately selected, and for specific details thereof, for example, US-2017-0052444-A1 may be referred to, which is incorporated herein in its entirety.

In the preparation of the composition according to an embodiment, each of the above-described components may be manufactured sequentially or simultaneously mixed, and the order thereof is not particularly limited.

Figure 2A:
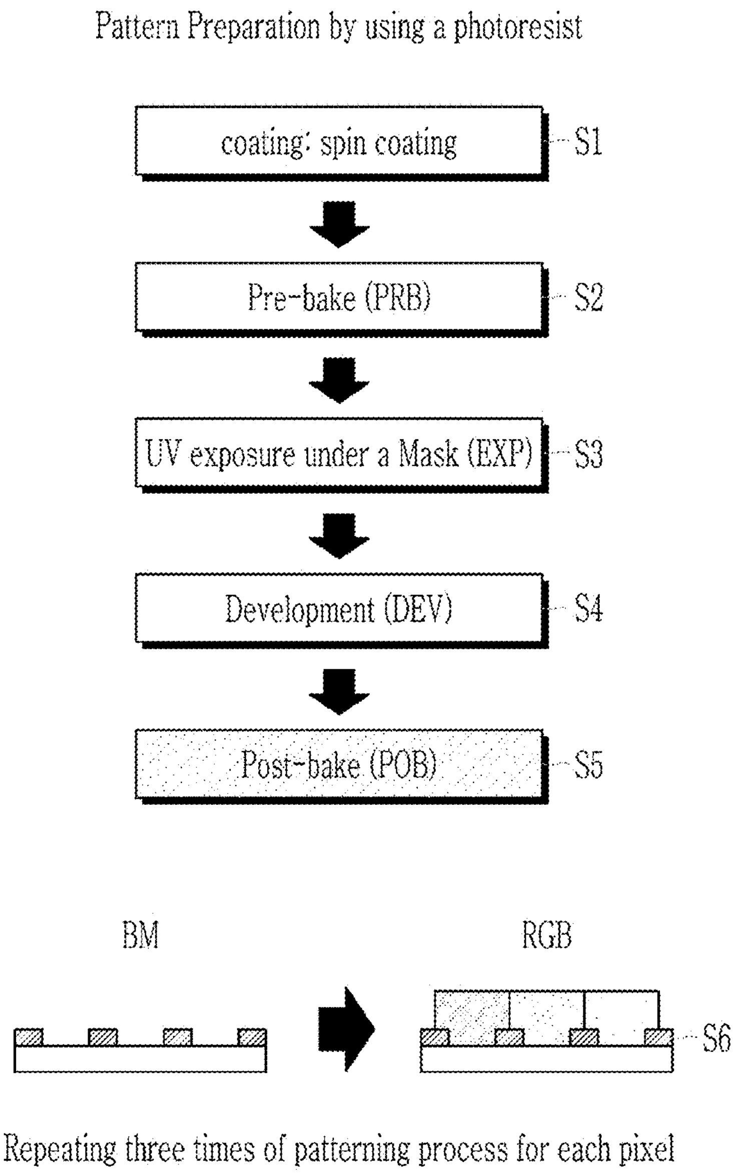
FIG. 2A is a flowchart showing pattern formation process (photolithography method) using the ink composition of one or more embodiments.

The composition may provide a color conversion layer (or a patterned film of the composite) by (e.g., radical) polymerization. The color conversion layer (or the patterned film of the composite) may be produced using a photoresist composition. Referring to FIG. 2A, this method may include forming a film of the aforementioned composition on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot-polymer composite (S4).

Referring to FIG. 2A, the aforementioned composition may be applied to a predetermined thickness on a substrate using an appropriate method such as spin coating or slit coating to form a film. The formed film may be optionally subjected to a pre-baking (PRB) step. The pre-baking may be performed by selecting an appropriate condition from known conditions of a temperature, time, an atmosphere, or the like.

The formed (or optionally prebaked) film is exposed to light having a predetermined wavelength under a mask having a predetermined pattern (EXP). A wavelength and intensity of the light may be selected considering types and contents of the photoinitiator, types and contents of the quantum dots, or the like.

The exposed film may then be treated with an alkali developing solution (e.g., dipping or spraying) to dissolve an unexposed region and obtain a desired pattern (DEV). The obtained pattern may be, optionally, post-exposure baked (POB) to improve crack resistance and solvent resistance of the pattern, for example, at a temperature of about 150° C. to about 230° C. for a predetermined time (e.g., greater than or equal to about 10 minutes, or greater than or equal to about 20 minutes) (S5).

When the color conversion layer or the patterned film of the nanoparticle composite has a plurality of repeating sections (that is, color conversion regions), each repeating section may be formed by preparing a plurality of compositions including quantum dots (e.g., red light emitting quantum dots, green light emitting quantum dots, or optionally, blue light emitting quantum dots) having desired luminous properties (photoluminescence peak wavelength or the like) and repeating the aforementioned pattern-forming process as many times as necessary (e.g., 2 times or more, or 3 times or more) for each composition, resultantly obtaining a nanoparticle-polymer composite having a desired pattern (S6). For example, the nanoparticle-polymer composite may have a pattern of at least two repeating color sections (e.g., RGB color sections). This nanoparticle-polymer composite pattern may be used as a photoluminescence type color filter in a display device.

Figure 2B:
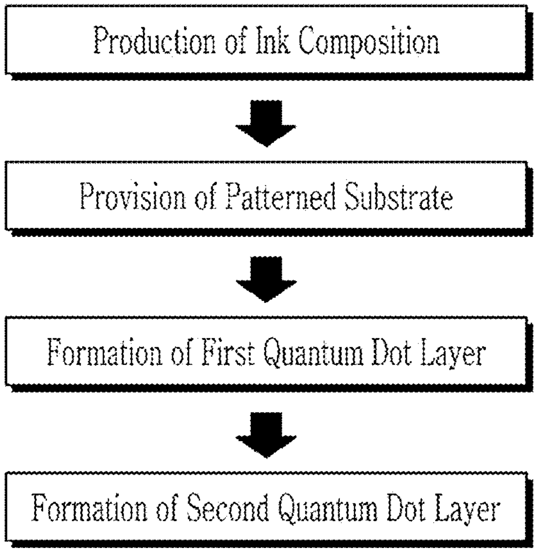
FIG. 2B is a flowchart showing a pattern forming process (inkjet method) using the ink composition of one or more embodiments.

The color conversion layer or patterned film of the nanoparticle composite may be produced using an ink composition configured to form a pattern in an inkjet manner. Referring to FIG. 2B, such a method may include preparing an ink composition according to one or more embodiments, providing a substrate (e.g., with pixel areas patterned by electrodes and optionally banks or trench-type partition walls, or the like), and depositing an ink composition on the substrate (or the pixel area) to form, for example, a first composite layer (or first region). The method may include depositing an ink composition on the substrate (or the pixel area) to form, for example, a second composite layer (or second region). The first and second composite layers may be first and second quantum dot layers, respectively. The forming of the first composite layer and forming of the second composite layer may be simultaneously or sequentially carried out.

The depositing of the ink composition may be performed using an appropriate liquid crystal discharger, for example an inkjet or nozzle printing system (having an ink storage and at least one print head). The deposited ink composition may provide a (first or second) composite layer through the solvent removal and polymerization by the heating. The method may provide a highly precise nanoparticle-polymer composite film or patterned film for a short time by the simple method.

In the nanoparticle-polymer composite (e.g., first composite) of one or more embodiments, the (polymer) matrix may include the components described herein with respect to the composition. In the composite, an amount of the matrix, based on a total weight of the composite, may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %. The amount of the matrix may be, based on a total weight of the composite, less than or equal to about 95 wt %, less than or equal to about 90 wt %, less than or equal to about 80 wt %, less than or equal to about 70 wt %, less than or equal to about 60 wt %, or less than or equal to about 50 wt %.

The (polymer) matrix may include at least one of a dispersant (e.g., a carboxylic acid group-containing binder polymer), a polymerization product (e.g., an insulating polymer) of a polymerizable monomer including (at least one, for example, at least two, at least three, at least four, or at least five) carbon-carbon double bonds, and a polymerization product of the polymerizable monomer and a multithiol compound having at least two thiol groups at a terminal end. The matrix may include a linear polymer, a crosslinked polymer, or a combination thereof. The (polymer) matrix may not include a conjugated polymer (excluding cardo resin). The matrix may include a conjugated polymer.

The crosslinked polymer may include a thiol-ene resin, a crosslinked poly(meth)acrylate, a crosslinked polyurethane, a crosslinked epoxy resin, a crosslinked vinyl polymer, a crosslinked silicone resin, or a combination thereof. In one or more embodiments, the crosslinked polymer may be a polymerization product of the aforementioned polymerizable monomers and optionally a multithiol compound.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The (polymer) matrix may include a carboxylic acid group-containing compound (e.g., a binder, a binder polymer, or a dispersant) (e.g., for dispersion of nanoparticles or a binder).

The first composite (or film or pattern thereof) may have, for example, a thickness of less than or equal to about 25 μm, less than or equal to about 20 μm, less than or equal to about 15 μm, less than or equal to about 10 μm, less than or equal to about 8 μm, or less than or equal to about 7 μm to greater than about 2 μm, for example, greater than or equal to about 3 μm, greater than or equal to about 3.5 μm, greater than or equal to about 4 μm, greater than or equal to about 5 μm, greater than or equal to about 6 μm, greater than or equal to about 7 μm, greater than or equal to about 8 μm, greater than or equal to about 9 μm, or greater than or equal to about 10 μm.

The aforementioned nanoparticle(s), composite (or pattern thereof) including the aforementioned nanoparticle(s), or a color conversion panel including the same may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but embodiments are not limited thereto. The aforementioned quantum dot may be included in an electronic apparatus. Such an electronic apparatus may include, but is not limited to, a portable terminal device, a monitor, a notebook PC, a television, an electric sign board, a camera, a car, or the like, but embodiments are not limited thereto. The electronic apparatus may be a portable terminal device, a monitor, a note PC, or a television including a display device (or a light emitting device) including quantum dots. The electronic apparatus may be a camera or a mobile terminal device including an image sensor including quantum dots. The electronic apparatus may be a camera or a vehicle including a photodetector including quantum dots.

An embodiment provides a color conversion layer (e.g., a color conversion structure or a color conversion panel) including a color conversion region including the semiconductor nanoparticle described herein. The color conversion panel includes a color conversion layer including a color conversion region and optionally a partition wall defining each region of the color conversion layer, the color conversion region includes a first region corresponding to a first pixel, and the first region includes the semiconductor nanoparticles or the composite. In the color conversion panel of an embodiment, the composite may be in the form of a patterned film. In another embodiment, the composite may have a sheet form.

The first region includes a first composite, and the first composite includes a matrix and semiconductor nanoparticles dispersed in the matrix and is configured to emit first light. An embodiment provides the semiconductor nanoparticles or a population thereof.

Figure 3A:
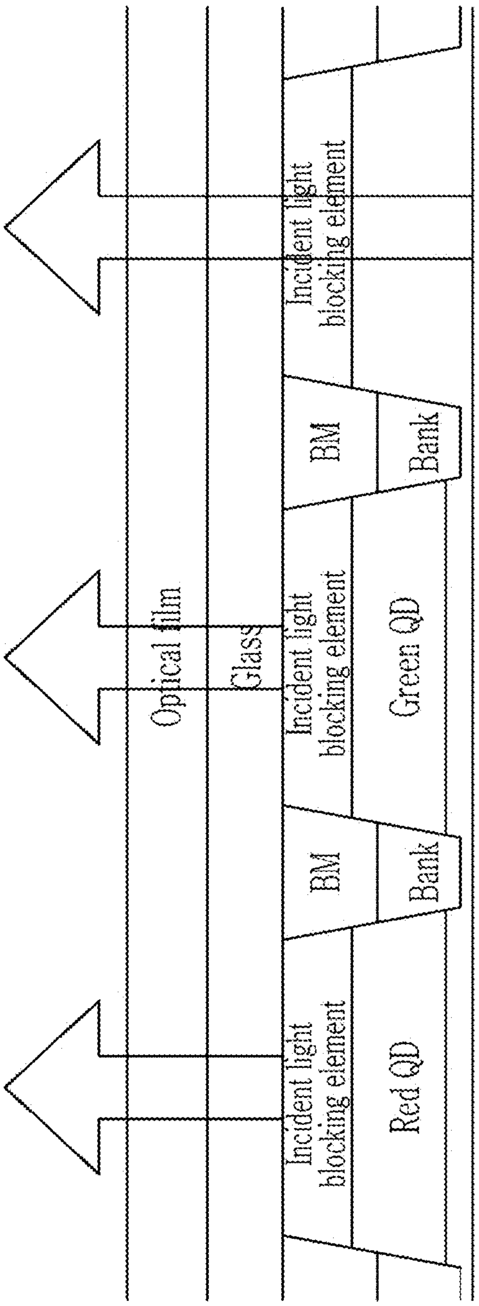
FIG. 3A is a schematic cross-sectional view of a color conversion panel according to one or more embodiments.
Figure 3B:
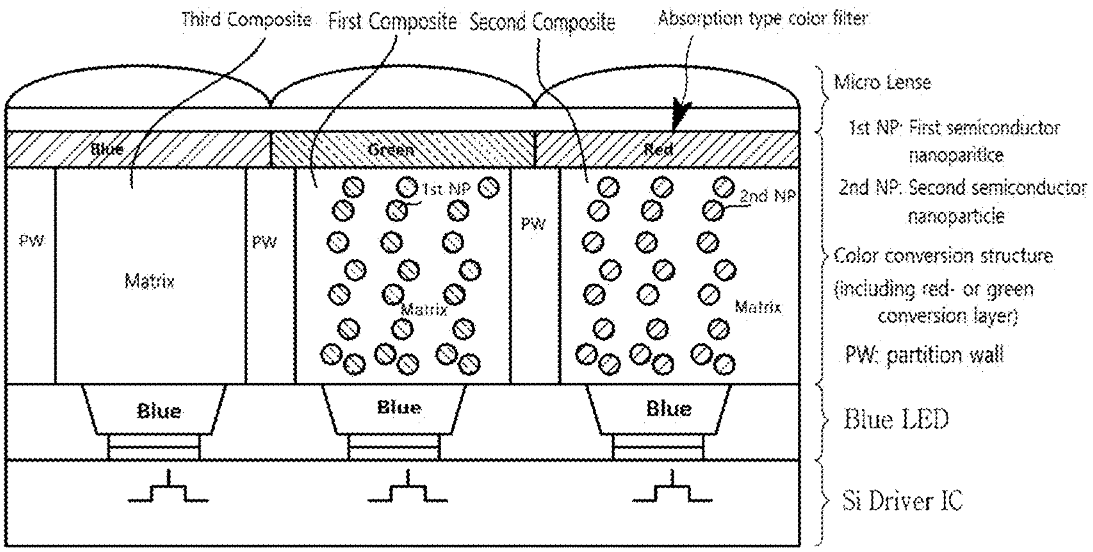
FIG. 3B is a cross-sectional view of an electronic device (display device) including a color conversion panel according to one or more embodiments.

The color conversion layer (e.g., a color conversion structure) may include the composite or a patterned film thereof according to one or more embodiments. FIG. 3A is a schematic cross-sectional view of a color conversion panel according to one or more embodiments. Referring to FIG. 3A, the color conversion panel may optionally further include a partition wall (e.g., a black matrix (BM), a bank, or a combination thereof) that defines each region of the color conversion layer (e.g., a color conversion structure). FIG. 3B illustrates an electronic device (a display device) including a color conversion panel and a light source according to another embodiment. In the electronic device of one or more embodiments, a color conversion panel including a color conversion layer or a color conversion structure is disposed on an LED on a chip (e.g., a micro LED on a chip). Referring to FIG. 3B, a circuit (e.g., Si driver IC) configured to drive the light source may be disposed under a light source (e.g., blue LED) configured to emit incident light (e.g., a blue light). The color conversion layer may include a first composite including a semiconductor nanoparticle emitting a first light (e.g., a green light), and a second composite including a semiconductor nanoparticle emitting a second light (e.g., a red light), or a third composite that emits or passes a third light (e.g., incident light or a blue light). A partition wall PW (e.g., including an inorganic material such as silicon or silicon oxide, or based on an organic material) may be disposed between respective composites. The partition wall may include a trench hole, a via hole, or a combination thereof. A first optical element (e.g., an absorption type color filter) may be disposed on a light extraction surface of a color conversion layer. An additional optical element such as a micro lens may be further disposed on the first optical element.

The color conversion region includes a first region configured to emit the aforementioned first light (or green light) (e.g., by irradiation with an incident light). In one or more embodiments, the first region may correspond to a green pixel. The first region includes a first composite (e.g., a luminescence type composite). The first light may have a peak emission wavelength within a wavelength range to be described later. The first light will be described in more detail for the semiconductor nanoparticles described herein. The peak emission wavelength of the green light may be greater than or equal to about 500 nm, greater than or equal to about 501 nm, greater than or equal to about 504 nm, greater than or equal to about 505 nm, or greater than or equal to about 520 nm. The peak emission wavelength of the green light may be less than or equal to about 580 nm, less than or equal to about 560 nm, less than or equal to about 550 nm, less than or equal to about 530 nm, less than or equal to about 525 nm, less than or equal to about 520 nm, less than or equal to about 515 nm, or less than or equal to about 510 nm.

The color conversion region may further include a (e.g., one or more) second region that is configured to emit a second light (e.g., a red light) different from the first light (e.g., by irradiation with excitation light). The second region may include a second composite. The semiconductor nanoparticle composite in the second region may include a semiconductor nanoparticle (e.g., a quantum dot) being configured to emit a light of a different wavelength (e.g., a different color) from the semiconductor nanoparticle composite disposed in the first region.

The second light may be a red light having a peak emission wavelength of about 600 nm to about 650 nm (e.g., about 620 nm to about 650 nm). The color conversion panel may further include (one or more) third regions that emit or pass a third light (e.g., a blue light) different from the first light and the second light. An incident light may include the third light (e.g., a blue light and optionally a green light). The third light may include a blue light having a peak emission wavelength of greater than or equal to about 380 nm (e.g., greater than or equal to about 440 nm, greater than or equal to about 445 nm, greater than or equal to about 450 nm, or greater than or equal to about 455 nm) to less than or equal to about 480 nm (e.g., less than or equal to about 475 nm, less than or equal to about 470 nm, less than or equal to about 465 nm, or less than or equal to about 460 nm).

In one or more embodiments, the color conversion panel or the color conversion layer may include a plurality of first regions, and the composite may constitute a predetermined pattern to be respectively disposed in the first regions of the color conversion panel. The composite (or a pattern thereof) may be prepared from the (ink) composition by any method, for example, in a photolithography manner or in an inkjet printing manner. Accordingly, one or more embodiments relates to a composition including a semiconductor particle, which was described herein in further detail.

In one or more embodiments, the electronic device or the display device (e.g., display panel) may further include a color conversion layer (or a color conversion panel) and optionally, a light source. The light source may provide incident light to the color conversion layer or the color conversion panel. In one or more embodiments, the display panel includes a light emitting panel (or a light source), the aforementioned color conversion panel, and a light transmitting layer located between the aforementioned light emitting panel and the aforementioned color conversion panel. The color conversion panel includes a substrate, and the color conversion layer may be disposed on the substrate.

When present, the light source or the light emitting panel may provide an incident light to the color conversion layer or the color conversion panel. The incident light may have a peak emission wavelength of greater than or equal to about 440 nm, for example, greater than or equal to about 450 nm, and less than or equal to about 580 nm, for example, less than or equal to about 480 nm, less than or equal to about 470 nm, or less than or equal to about 460 nm.

In one or more embodiments, the electronic device (e.g., a photoluminescent device) may further include a sheet of the nanoparticle composite. Referring to FIG. 4B, the device 400 may include a backlight unit 410 and a liquid crystal panel 420, optionally wherein the backlight unit 410 may include a quantum dot polymer composite sheet (QD sheet). For example, the backlight unit 410 may have a structure that a reflector, a light guide plate (LGP), a light source (a blue LED or the like), the quantum dot polymer composite sheet (QD sheet), and an optical film (a prism, a double brightness enhance film (DBEF, or the like) may be stacked. The liquid crystal panel 420 may be disposed on the backlight unit 410 and have a structure where a thin film transistor (TFT), liquid crystals (LC), and a color filter (color filter) are included between two polarizers (Pol). The quantum dot polymer composite sheet (QD sheet) may include semiconductor nanoparticles (e.g., quantum dots) emitting a red light and a green light after absorbing light from the light source. A blue light provided from the light source may be combined with the red light and the green light emitted from the respective semiconductor nanoparticles, while passing the quantum dot polymer composite sheet, and converted into a white light. The white light may be separated into a blue light, a green light, and a red light by a color filter in the liquid crystal panel, and then emitted to the outside for each pixel. Referring to FIG. 4D, the backlight unit (BLU) may be a direct type of a BLU without a light guide plate, and may include a plurality of LEDs (e.g., mini LEDs) and a photoconversion sheet or a QD sheet may be disposed on the BLU.

The color conversion panel may include a substrate, and the color conversion layer may be disposed on the substrate. The color conversion layer or the color conversion panel may include a patterned film of the nanoparticle composite. The patterned film may include a repeating section that is configured to emit light of a desired wavelength. The repeating section may include a second region. The second region may be a red light-emitting section. The repeating section may include a first region. The first region may be a green light-emitting section. The repeating section may include a third region. The third region may include a section that emits or transmits a blue light. Details of the first, second, and third regions are as described herein.

The light emitting panel or the light source may be an element emitting an incident light (e.g., an excitation light). The incident light may include a blue light, and, optionally, a green light. The light source may include an LED. The light source may include an organic LED (OLED). The light source may include a micro LED. On the front surface (light emitting surface) of the first region and the second region, an optical element to block (e.g., reflect or absorb) a blue light (and optionally a green light) for example, a blue light (and optionally a green light) blocking layer or a first optical filter that will be described herein may be disposed. In one or more embodiments, the light source may include an organic light emitting diode to emit a blue light and an organic light emitting diode to emit a green light, and a green light removing filter may be further disposed on a third region through which a blue light is transmitted.

The light emitting panel or the light source may include a plurality of light emitting units respectively corresponding to the first region and the second region, and the light emitting units may include a first electrode and a second electrode facing each other, and an (organic) electroluminescent layer located between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., a blue light, a green light, or a combination thereof). Structures and materials of the electroluminescent device and the organic light emitting diode (OLED) are not particularly limited.

Hereinafter, the display panel and the color conversion panel will be described in further detail with reference to the drawings.

Figure 4A:
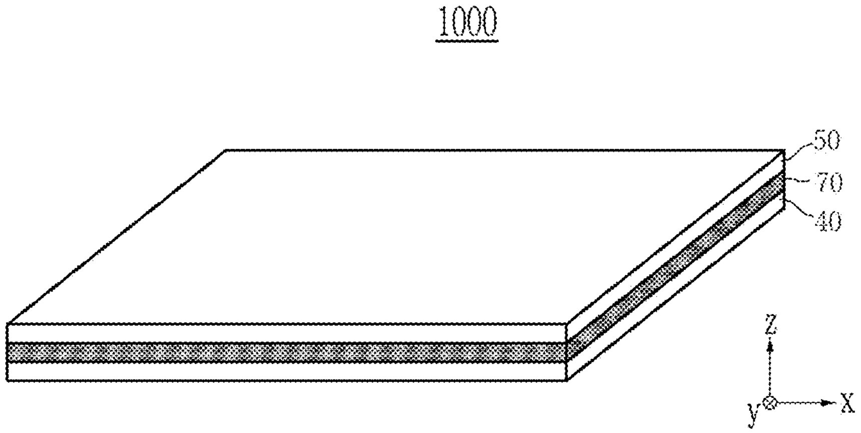
FIG. 4A is a perspective view illustrating an example of a display panel including a color conversion panel according to one or more embodiments.
Figure 4B:
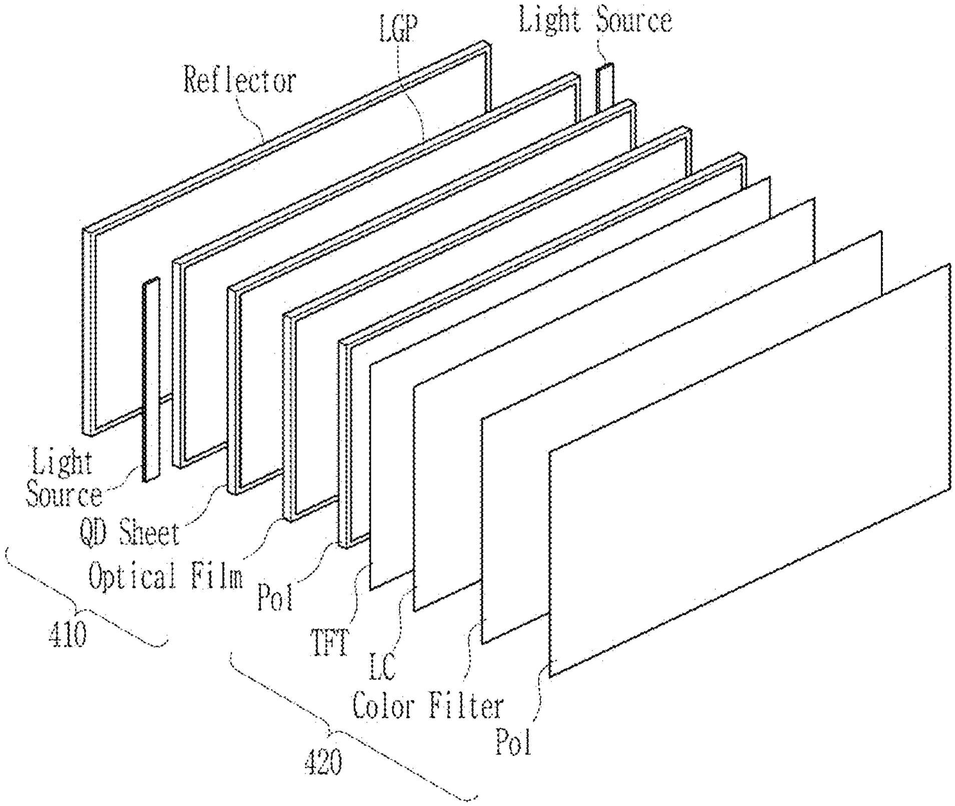
FIG. 4B is an exploded view of a display device according to one or more embodiments.
Figure 4C:
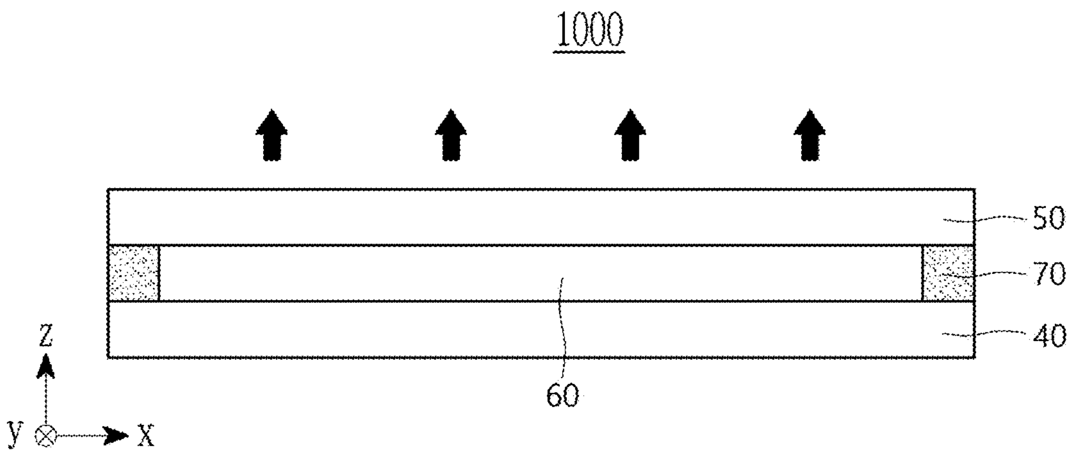
FIG. 4C is a cross-sectional view of the display panel of FIG. 4A.
Figure 4D:
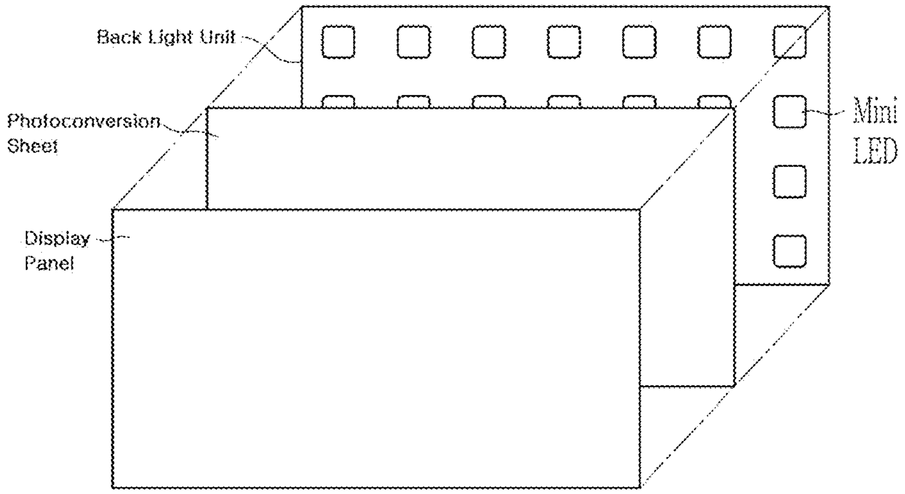
FIG. 4D is an exploded view of a display device according to one or more embodiments.

Referring to FIGS. 4A and 4C, the display panel 1000 according to one or more embodiments includes a light emitting panel 40 and a color conversion panel 50. The display panel or the electronic device may further include a light transmitting layer 60 disposed between the light emitting panel 40 and the color conversion panel 50, and a binding material 70 binding the light emitting panel 40 and the color conversion panel 50. The light transmitting layer may include a passivation layer, a filling material, an encapsulation layer, or a combination thereof (not shown). A material for the light transmitting layer may be appropriately selected without particular limitation. The material for the light transmitting layer may be an inorganic material, an organic material, an organic/inorganic hybrid material, or a combination thereof.

The light emitting panel 40 and the color conversion panel 50 each have a surface opposite the other, i.e., the two respective panels face each other, with the light transmitting layer (or the light transmitting panel) 60 disposed between the two panels. The color conversion panel 50 is disposed in a direction such that for example, light emitting from the light emitting panel 40 irradiates the light transmitting layer 60. The binding material 70 is disposed along edges of the light emitting panel 40 and the color conversion panel 50, and may be, for example, a sealing material.

Figure 5A:
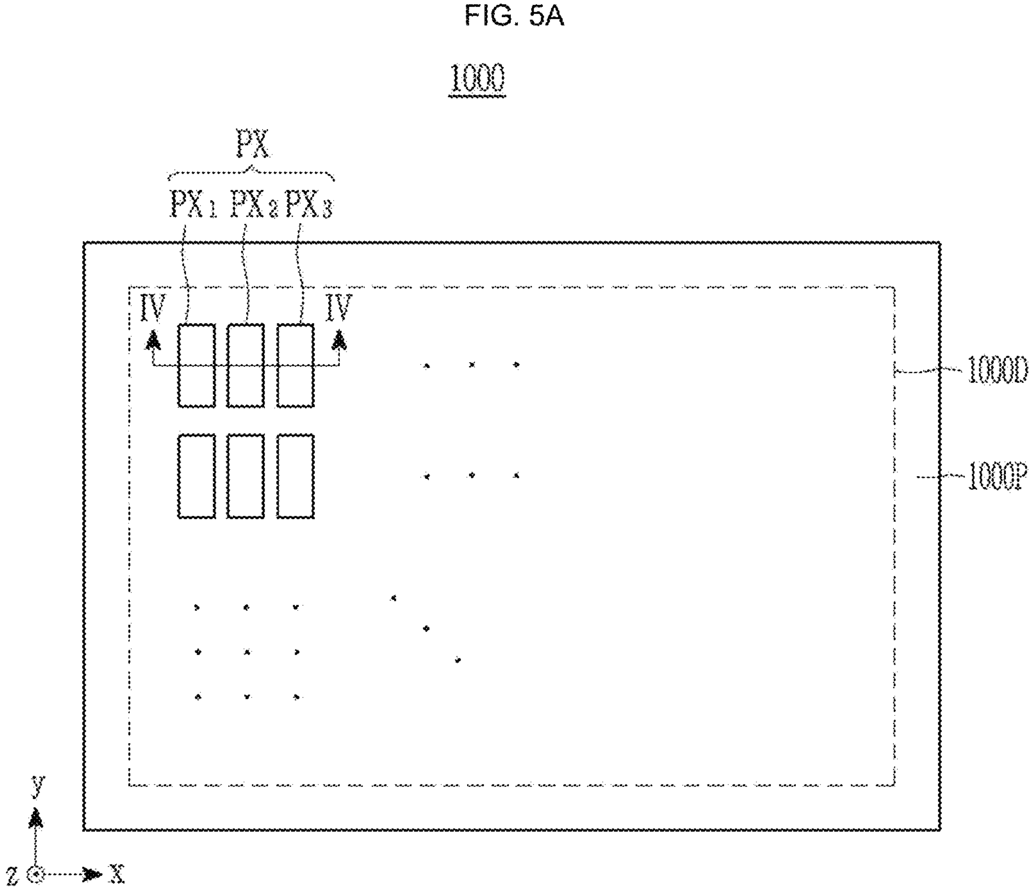
FIG. 5A is a plan view illustrating an example of a pixel arrangement of the display panel of FIG. 4A.

FIG. 5A is a plan view of one or more embodiments of a pixel arrangement of a display panel. Referring to FIG. 5A, the display panel 1000 includes a display area 1000D displaying an image and a non-display area 1000P positioned in a peripheral area of the display area 1000D and disposed with a binding material.

The display area 1000D includes a plurality of pixels PX arranged along a row (e.g., an x direction), and a column (e.g., a y direction), and each representative pixel PX may include a plurality of sub-pixels $PX_1$, $PX_2$, and $PX_3$ expressing, e.g., displaying, different colors from each other. One or more embodiments are exemplified with a structure in which three sub-pixels $PX_1$, $PX_2$, and $PX_3$ are configured to provide a pixel. One or more embodiments may further include an additional sub-pixel such as a white sub-pixel and may further include, e.g., at least one, sub-pixel expressing, e.g., displaying the same colors. The plurality of pixels PX may be aligned, for example, in a Bayer matrix, a matrix sold under the trade designation PenTile, a diamond matrix, or the like, or a combination thereof.

The sub-pixels $PX_1$, $PX_2$, and $PX_3$ may express, e.g., display, three primary colors or a color of a combination of three primary colors, for example, may express, e.g., display, a color of red, green, blue, or a combination thereof. For example, the first sub-pixel $PX_1$ may express, e.g., display, a red color, and the second sub-pixel $PX_2$ may express, e.g., display, a green color, and the third sub-pixel $PX_3$ may express, e.g., display, a blue color.

In the drawing, all sub-pixels are exemplified to have the same size, but these are not limited thereto, and at least one of the sub-pixels may be larger or smaller than other sub-pixels. In the drawing, all sub-pixels are exemplified to have the same shape, but it is not limited thereto and at least one of the sub-pixels may have a different shape from the other sub-pixels.

In the display panel or electronic device according to one or more embodiments, the light emitting panel may include a substrate and a TFT (e.g., an oxide-containing TFT, or the like) disposed on the substrate. A light emitting device (e.g., having a tandem structure, or the like) may be disposed on the TFT.

The light emitting device may include a light emitting layer (e.g., a blue light emitting layer, a green light emitting layer, or a combination thereof) located between the first electrode and the second electrode facing each other. A charge generation layer may be disposed between each of the light emitting layers. Each of the first electrode and the second electrode may be patterned with a plurality of electrode elements to correspond to the pixel. The first electrode may be an anode or a cathode. The second electrode may be a cathode or an anode.

The light emitting device may include an organic LED, a nanorod LED, a mini LED, a micro LED, or a combination thereof.

FIGS. 5B to 5E are cross-sectional views showing examples of light emitting devices, respectively. In an embodiment, "a mini LED" may have a size of greater than or equal to about 100 micrometers, greater than or equal to about 150 micrometers, greater than or equal to about 200 micrometers and less than or equal to about 1 millimeter, less than or equal to about 0.5 millimeters, less than or equal to about 0.15 millimeters, or less than or equal to about 0.12 millimeters, but is not limited thereto. In an embodiment, "a micro LED" may have a size of less than about 100 micrometers, less than or equal to about 50 micrometers, or less than or equal to about 10 micrometers. The size of the micro LED may be greater than or equal to about 0.1 micrometers, greater than or equal to about 0.5 micrometers, greater than or equal to about 1 micrometer, or greater than or equal to about 5 micrometers, but is not limited thereto.

Figure 5B:
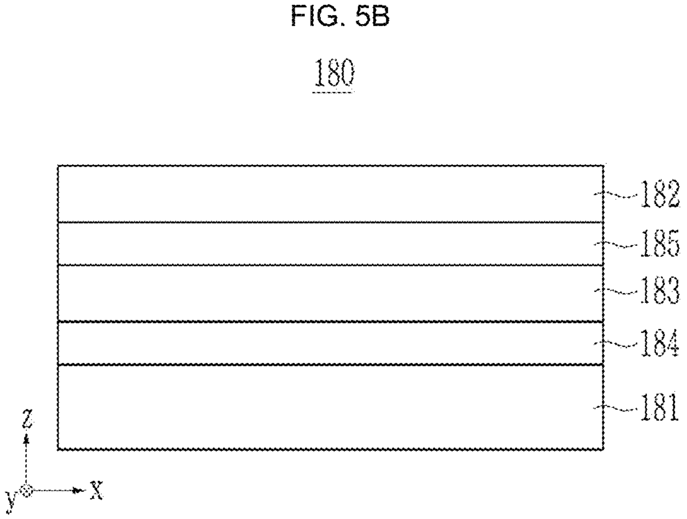
FIGS. 5B, 5C, 5D, and 5E are cross-sectional views showing examples of light emitting devices, respectively, according to one or more embodiments.

Referring to FIG. 5B, the light emitting device 180 may include a first electrode 181 and a second electrode 182 facing each other; a light emitting layer 183 located between the first electrode 181 and the second electrode 182; and optionally auxiliary layers 184 and 185 located between the first electrode 181 and the light emitting layer 183, and located between the second electrode 182 and the light emitting layer 183, respectively.

The first electrode 181 and the second electrode 182 may be disposed to face each other along a thickness direction (for example, a z direction), and any one of the first electrode 181 and the second electrode 182 may be an anode and the other may be a cathode. The first electrode 181 may be a light transmitting electrode, a semi-transparent electrode, or a reflective electrode, and the second electrode 182 may be a light transmitting electrode or a semi-transparent electrode. The light transmitting electrode or semi-transparent electrode may be, for example, made of a thin single layer or multiple layers of a metal thin film including conductive metal oxides such as indium tin oxide (ITO), indium zinc oxide (IZO), zinc oxide (ZnO), tin oxide (SnO), aluminum tin oxide (AlTO), fluorine-doped tin oxide (FTO), or the like; or silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but embodiments are not limited thereto.

The light emitting layer(s) 183 may include a first light emitting body emitting light with a blue emission spectrum, a second light emitting body emitting light with a green emission spectrum, or a combination thereof.

The blue emission spectrum may have a peak emission wavelength in a wavelength region of greater than or equal to about 400 nm to less than about 500 nm and within the range, in a wavelength region of about 410 nm to about 490 nm, about 420 nm to about 480 nm, about 430 nm to about 470 nm, about 440 nm to about 465 nm, about 445 nm to about 460 nm, or about 450 nm to about 458 nm.

The green emission spectrum may have a peak emission wavelength in a wavelength region of greater than or equal to about 500 nm to less than about 590 nm and within the range, in a wavelength region of about 510 nm to about 580 nm, about 515 nm to about 570 nm, about 520 nm to about 560 nm, about 525 nm to about 555 nm, about 530 nm to about 550 nm, or about 535 nm to about 545 nm.

For example, the light emitting layers 183 or the light emitting body included therein may include a phosphorescent material, a fluorescent material, or a combination thereof. For example, the light emitting body may include an organic light emitting body, wherein the organic light emitting body may be a low molecular compound, a polymer compound, or a combination thereof. Specific types of the phosphorescent material and the fluorescent material are not particularly limited but may be appropriately selected from known materials. For example, the light emitting body may include an inorganic light emitting body, and the inorganic light emitting body may be an inorganic semiconductor, a quantum dot, a perovskite, or a combination thereof. The inorganic semiconductor may include metal nitride, metal oxide, or a combination thereof. The metal nitride, the metal oxide, or the combination thereof may include a Group III metal such as aluminum, gallium, indium, thallium, or the like, a Group IV metal such as silicon, germanium, tin, or a combination thereof. In one or more embodiments, the light emitting body may include an inorganic light emitting body, and the light emitting device 180 may be a quantum dot light emitting diode, a perovskite light emitting diode, or a micro light emitting diode (μLED). Materials usable as the inorganic light emitting body may be selected appropriately.

In one or more embodiments, the light emitting device 180 may further include an auxiliary layer 184 and 185. The auxiliary layer 184 and 185 may be disposed between a first electrode 181 and a light emitting layer 183, and between a second electrode 182 and a light emitting layer 183, respectively. The auxiliary layer 184 and 185 may be a charge auxiliary layer for controlling injection and/or mobility of charges. The auxiliary layers 184 and 185 may include at least one layer or two layers, and for example, may include a hole injection layer, a hole transport layer, an electron blocking layer, an electron injection layer, an electron transport layer, a hole blocking layer, or a combination thereof. At least one of the auxiliary layers 184 and 185 may be omitted, if desired. The auxiliary layer may be formed of a material appropriately selected from materials known for an organic electroluminescent device, or the like.

The light emitting devices 180 disposed in each of the subpixels $PX_1$, $PX_2$, and $PX_3$ may be the same or different from each other. The light emitting devices 180 in each of the subpixels $PX_1$, $PX_2$, and $PX_3$ may emit a light having the same or different emission spectra. The light emitting devices 180 in each of the subpixels $PX_1$, $PX_2$, and $PX_3$ may emit, for example, light having a blue emission spectrum, light having a green emission spectrum, or a combination thereof. The light emitting devices 180 in each of the subpixels $PX_1$, $PX_2$, and $PX_3$ may be separated by a pixel defining layer (not shown).

Figure 5C:
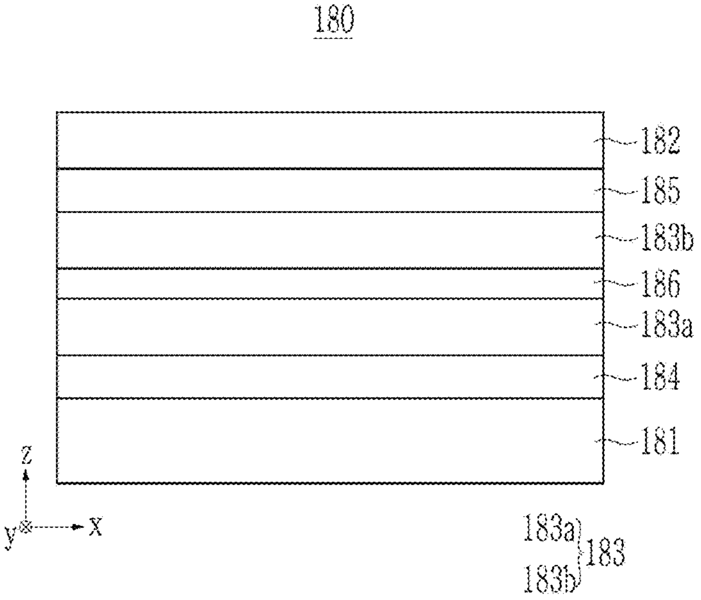

Referring to FIG. 5C, the light emitting device 180 may be a light emitting device having a tandem structure, and includes a first electrode 181 and a second electrode 182 facing each other; a first light emitting layer 183*a* and a second light emitting layer 183*b* located between the first electrode 181 and the second electrode 182; a charge generation layer 186 located between the first light emitting layer 183*a* and the second light emitting layer 183*b*, and optionally auxiliary layers 184 and 185 located between the first electrode 181 and the first light emitting layer 183*a*, and/or between the second electrode 182 and the second light emitting layer 183*b*, respectively.

Details of the first electrode 181, the second electrode 182, and the auxiliary layers 184 and 185 are as described herein.

The first light emitting layer 183*a* and the second light emitting layer 183*b* may emit alight having the same or different emission spectra. In one or more embodiments, the first light emitting layer 183*a* or the second light emitting layer 183*b* may emit light having a blue emission spectrum or light having a green emission spectrum, respectively. The charge generation layer 186 may inject an electric charge into the first light emitting layer 183*a* and/or the second light emitting layer 183*b*, and may control a charge balance between the first light emitting layer 183*a* and the second light emitting layer 183*b*. The charge generation layer 186 may include, for example, an n-type layer and a p-type layer, and may include, for example, an electron transport material and/or a hole transport material including an n-type dopant and/or a p-type dopant. The charge generation layer 186 may include one layer or two or more layers.

Figure 5D:
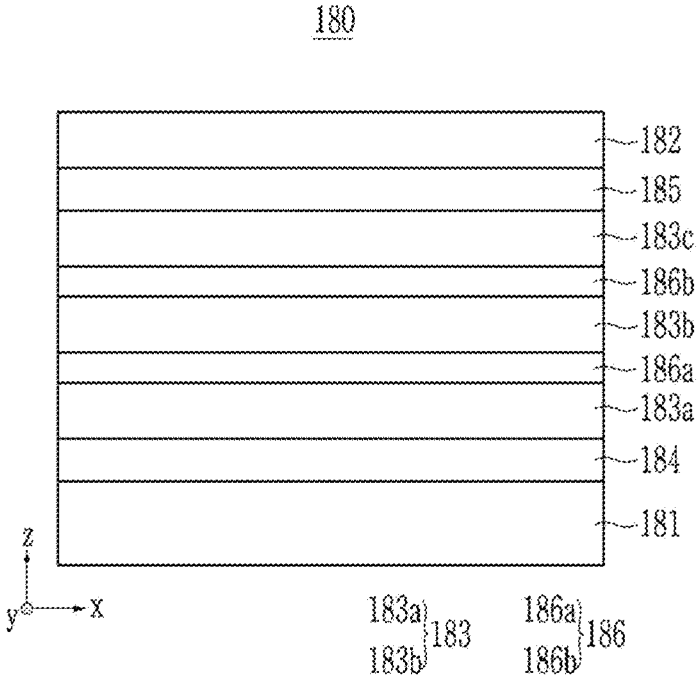

Referring to FIG. 5D, a light emitting device (having a tandem structure) may include a first electrode 181 and a second electrode 182 facing each other; a first light emitting layer 183*a*, a second light emitting layer 183*b*, and a third light emitting layer 183*c* located between the first electrode 181 and the second electrode 182; a first charge generation layer 186*a* located between the first light emitting layer 183*a* and the second light emitting layer 183*b*; a second charge generation layer 186*b* located between the second light emitting layer 183*b* and the third light emitting layer 183*c*; and optionally, auxiliary layers 184 and 185 located between the first electrode 181 and the first light emitting layer 183*a*, and/or between the second electrode 182 and the third light emitting layer 183*c*, respectively.

Details of the first electrode 181, the second electrode 182, and the auxiliary layers 184 and 185 are as described herein.

The first light emitting layer 183*a*, the second light emitting layer 183*b*, and the third light emitting layer 183*c* may emit a light having the same or different emission spectra. The first light emitting layer 183*a*, the second light emitting layer 183*b*, and the third light emitting layer 183*c* may emit a blue light. In one or more embodiments, the first light emitting layer 183*a* and the third light emitting layer 183*c* may emit light of a blue emission spectrum, and the second light emitting layer 183*b* may emit light of a green emission spectrum. In another embodiment, the first light emitting layer 183*a* and the third light emitting layer 183*c* may emit light of a green emission spectrum, and the second light emitting layer 183*b* may emit light of a blue emission spectrum.

The first charge generation layer 186*a* may inject an electric charge into the first light emitting layer 183*a* and/or the second light emitting layer 183*b*, and may control charge balances between the first light emitting layer 183*a* and the second light emitting layer 183*b*. The second charge generation layer 186*b* may inject an electric charge into the second light emitting layer 183*b* and/or the third light emitting layer 183*c*, and may control charge balances between the second light emitting layer 183*b* and the third light emitting layer 183*c*. Each of the first and second charge generation layers 186*a* and 186*b* may include one layer or two or more layers, respectively.

Figure 5E:
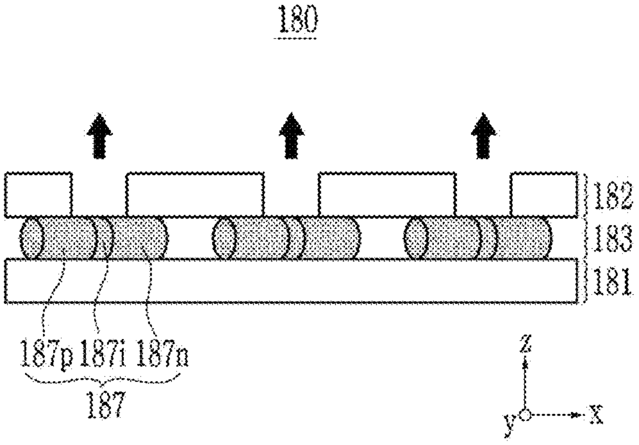

Referring to FIG. 5E, in one or more embodiments, the light emitting device 180 includes a light emitting layer 183, a first electrode 181, a second electrode 182, and a plurality of nanostructures 187 arranged in the light emitting layer 183.

One of the first electrode 181 and the second electrode 182 may be an anode and the other may be a cathode. The first electrode 181 and the second electrode 182 may be an electrode patterned according to a direction of an arrangement of the plurality of nanostructures 187, and may include, for example, a conductive oxide such as indium tin oxide (ITO), indium zinc oxide (IZO), zinc oxide (ZnO), tin oxide (SnO), aluminum tin oxide (AlTO), fluorine-doped tin oxide (FTO), or the like; or silver (Ag), copper (Cu), aluminum (Al), gold (Au), titanium (Ti), chromium (Cr), nickel (Ni), an alloy thereof, a nitride thereof (e.g., TiN); or a combination thereof, but embodiments are not limited thereto.

The light emitting layer 183 may include a plurality of nanostructures 187, and each of the subpixels $PX_1$, $PX_2$, and $PX_3$ may include a plurality of nanostructures 187. In one or more embodiments, the plurality of nanostructures 187 may be arranged in one direction, but embodiments are not limited thereto. The nanostructures 187 may be a compound-containing semiconductor that is configured to emit light of a predetermined wavelength for example with an application of an electric current, and may be, for example, a linear nanostructure such as a nanorod or a nanoneedle. A diameter or a long diameter of the nanostructures 187 may be, for example, several nanometers to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, greater than or equal to about 5.0, greater than about 1 to less than or equal to about 20, about 1.5 to about 20, about 2.0 to about 20, about 3.0 to about 20, about 4.0 to about 20, about 4.5 to about 20, or about 5.0 to about 20.

Each of the nanostructures 187 may include a p-type region 187*p*, an n-type region 187*n*, and a multiple quantum well region 187*i*, and may be configured to emit light from the multiple quantum well region 187*i*. The nanostructure 187 may include, for example, gallium nitride (GaN), indium gallium nitride (InGaN), aluminum gallium nitride (AlGaN), or a combination thereof, and may have, for example, a core-shell structure.

The plurality of nanostructures 187 may each emit light having the same or different emission spectra. In one or more embodiments, the nanostructure may emit light of a blue emission spectrum, for example, light of a blue emission spectrum having a peak emission wavelength in a wavelength region of greater than or equal to about 400 nm to less than 500 nm, about 410 nm to about 490 nm, or about 420 nm to about 480 nm.

Figure 6:
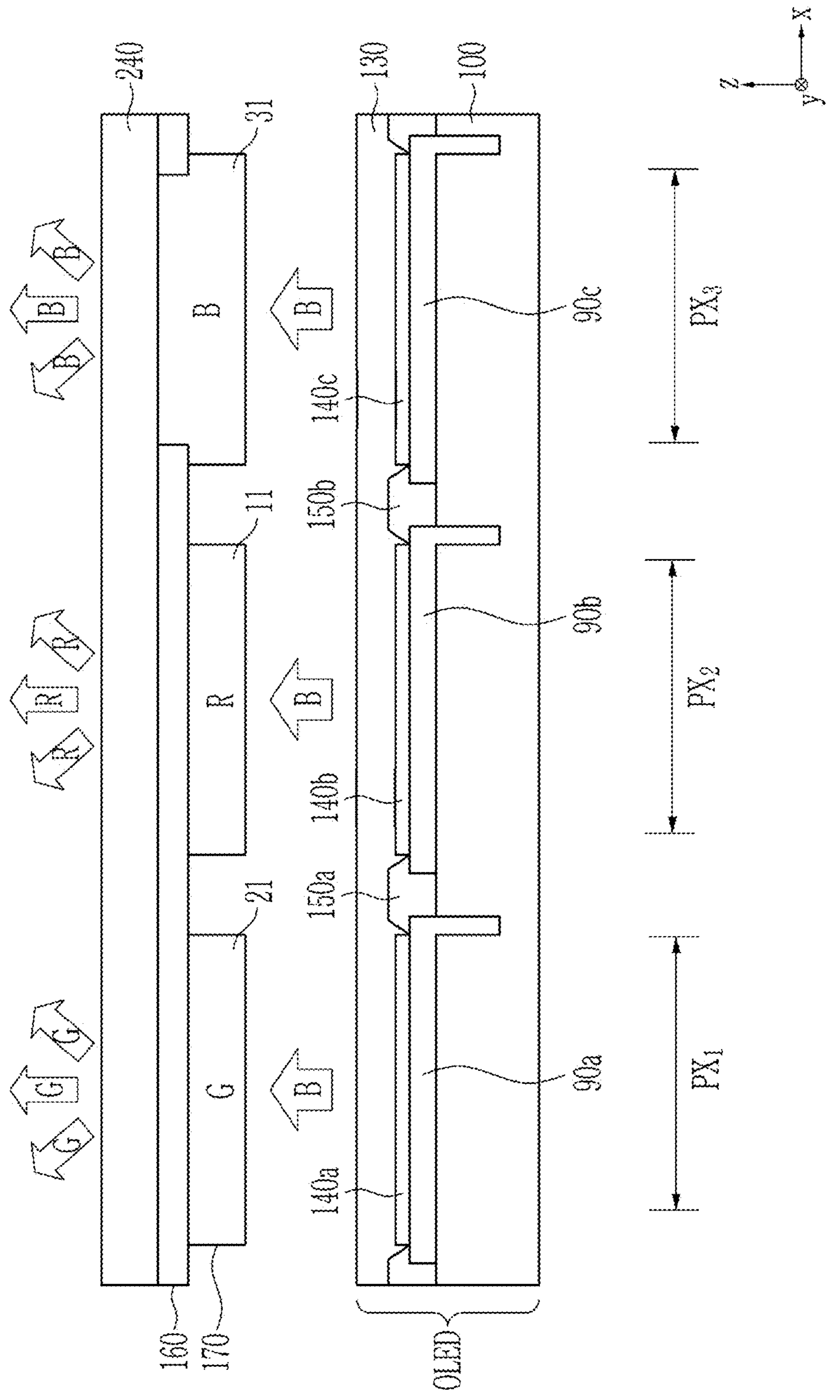
FIG. 6 is a cross-sectional view of the display panel of FIG. 5A taken along line IV-IV.

FIG. 6 is a schematic cross-sectional view of a device (or a display panel) according to one or more embodiments. Referring to FIG. 6, the light source (or the light emitting panel) may include an organic light emitting diode that emits a blue light (B) (and optionally a green light (G)). The organic light emitting diode (OLED) may include at least two pixel electrodes 90*a*, 90*b*, 90*c* formed on the substrate 100, pixel defining layers 150*a*, 150*b* formed between the adjacent pixel electrodes 90*a*, 90*b*, 90*c*, organic light emitting layers 140*a*, 140*b*, 140*c* formed on each pixel electrode 90*a*, 90*b*, 90*c*, and a common electrode layer 130 formed on the organic light emitting layer 140*a*, 140*b*, 140*c*. A thin film transistor (TFT) and a substrate may be disposed under the organic light emitting diode (OLED), which are not shown. Pixel areas of the OLED may be disposed corresponding to the first, second, and third regions described herein. In one or more embodiments, the color conversion panel and the light emitting panel may be separated as shown in FIG. 6. In one or more embodiments, the color conversion panel may be stacked directly on the light emitting panel.

A laminated structure including the luminescent nanostructure composite pattern 170 (e.g., a first region 11 or R including red light emitting luminescent nanostructures, a second region 21 or G including green light emitting luminescent nanostructures, and a third region 31 or B including or not including a luminescent nanostructure, e.g., a blue light emitting luminescent nanostructure) and the substrate 240 may be disposed on the light source. The blue light emitted from the light source enters the first region and second region and may emit a red light and a green light, respectively. The blue light emitted from the light source may pass through the third region. An element (first optical filter 160 or excitation light blocking layer) configured to block the excitation light may be disposed between the luminescent nanostructure composite layers R and G and the substrate, if desired. In one or more embodiments, the excitation light includes a blue light and a green light, and a green light blocking filter (not shown) may be added to the third region. The first optical filter or the excitation light blocking layer will be described in more detail herein.

Such a (display) device may be produced by separately producing the aforementioned laminated structure and LED or OLED (e.g., emitting a blue light) and then combining the laminated structure and LED or OLED. The (display) device may be produced by directly forming the luminescent nanostructure composite pattern on the LED or OLED.

In the color conversion panel or a display device, a substrate may be a substrate including an insulation material. The substrate may include glass; a polymer such as a polyester of poly(ethylene terephthalate) (PET), poly(ethylene naphthalate) (PEN), or the like, a polycarbonate, or a polyacrylate; a polysiloxane (e.g. PDMS, or the like); an inorganic material such as $Al_2O_3$, ZnO, or the like; or a combination thereof, but embodiments are not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the semiconductor nanoparticle.

A wire layer including a thin film transistor or the like may be formed on the substrate. The wire layer may further include a gate line, a sustain voltage line, a gate insulating film, a data line, a source electrode, a drain electrode, a semiconductor layer, a protective layer, or the like. The detailed structure of the wire layer may vary depending on one or more embodiments. The gate line and the sustain voltage line may be electrically separated from each other, and the data line may be insulated and crossing the gate line and the sustain voltage line. The gate electrode, the source electrode, and the drain electrode may form a control terminal, an input terminal, and an output terminal of the thin film transistor, respectively. The drain electrode may be electrically connected to the pixel electrode that will be described herein.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light blocking properties are stacked sequentially.

Between two adjacent pixel electrodes, a pixel define layer (PDL) may overlap with a terminal end of the pixel electrode to divide the pixel electrode into a pixel unit. The pixel define layer is an insulating layer which may electrically block the at least two pixel electrodes.

The pixel define layer may cover a portion of the upper surface of the pixel electrode, and the remaining region of the pixel electrode where it is not covered by the pixel define layer may provide an opening. An organic light emitting layer that will be described herein may be formed on the region defined by the opening.

The organic light emitting layer may define each pixel area by the aforementioned pixel electrode and the pixel define layer. In other words, one pixel area may be defined as an area where it is formed with one organic light emitting unit layer which is contacted with one pixel electrode divided by the pixel define layer. In the display device according to one or more embodiments, the organic light emitting layer may be defined as a first pixel area, a second pixel area, and a third pixel area, and each pixel area may be spaced apart from each other leaving a predetermined interval by the pixel define layer.

In one or more embodiments, the organic light emitting layer may emit a third light belonging to a visible light region or belonging to an ultraviolet (UV) region. Each of the first to the third pixel areas of the organic light emitting layer may emit a third light. In one or more embodiments, the third light may be a light having a higher energy in a visible light region, and for example, may be a blue light (and optionally a green light). In one or more embodiments, all pixel areas of the organic light emitting layer are designed to emit the same light, and each pixel area of the organic light emitting layer may be formed of materials that are the same or similar or may show the same or similar properties. Thus, a process of forming the organic light emitting layer may be simplified, and the display device may be easily applied for, e.g., made by, a large scale/large area process. However, the organic light emitting layer according to one or more embodiments is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., a hole injection layer, a hole transport layer, an electron transport layer, or the like) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In one or more embodiments, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate located between the liquid crystal layer and the light emitting layer. The light source may further include LED, and, if desired, a light guide plate.

Figure 7A:
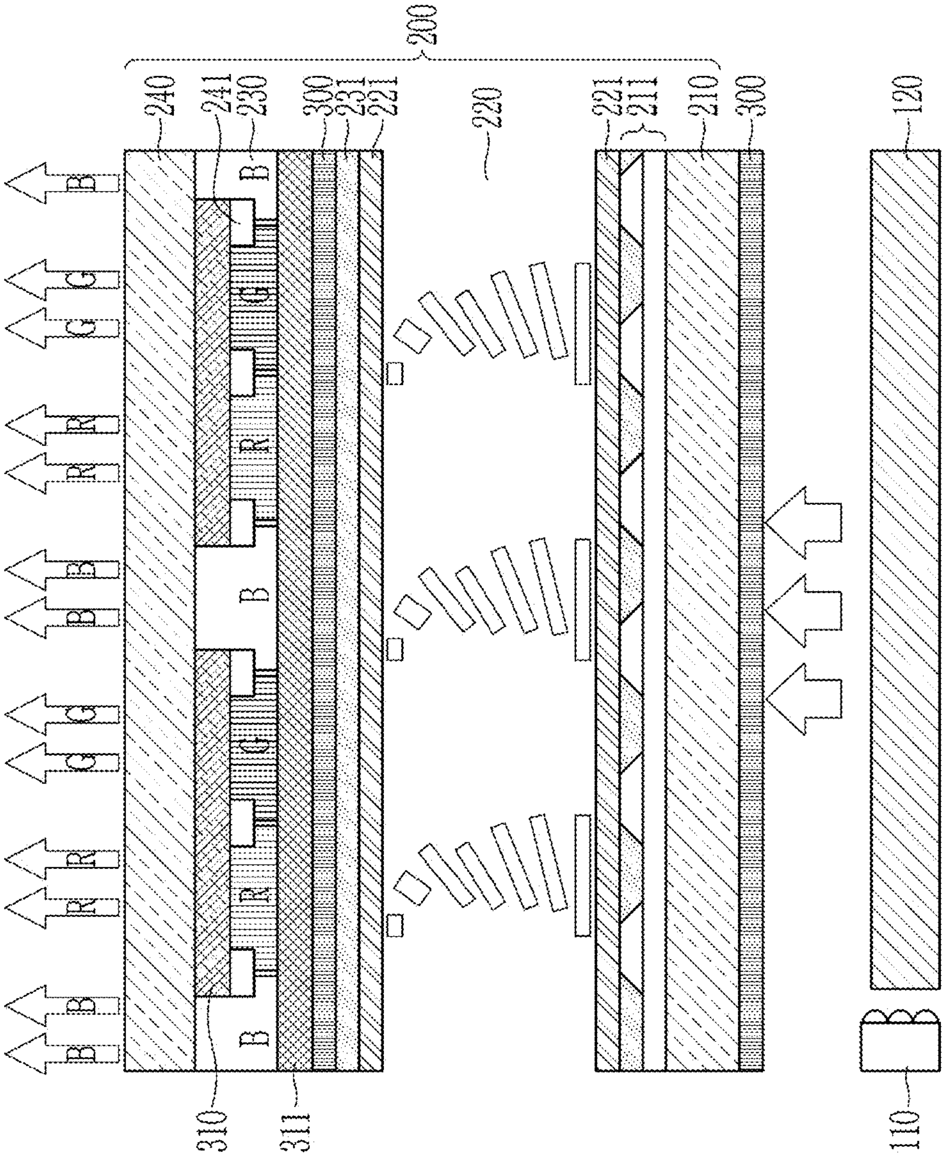
FIG. 7A is a schematic cross-sectional view of a display device (e.g., a liquid crystal display device) according to one or more embodiments.

In one or more embodiments, the display device (e.g., a liquid crystal display device) is illustrated with a reference to a drawing. FIG. 7A is a schematic cross-sectional view showing a liquid crystal display device according to one or more embodiments. Referring to FIG. 7A, the display device of one or more embodiments includes a liquid crystal panel 200, a polarizing plate 300 disposed under the liquid crystal panel 200, and a backlight unit disposed under the polarizing plate 300.

The liquid crystal panel 200 may include a lower substrate 210, a stacked structure, and a liquid crystal layer 220 disposed between the stack structure and the lower substrate. The stack structure may include a transparent substrate 240, a first optical filter layer 310, a photoluminescent layer 230 including a pattern of a semiconductor nanoparticle polymer composite, and a second optical filter layer 311.

The lower substrate 210, also referred to as an array substrate, may be a transparent insulating material substrate. The substrate may be as described herein. A wire plate 211 may be provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but embodiments are not limited thereto. Details of such a wire plate are not particularly limited.

A liquid crystal layer 220 may be provided on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 may be provided under the lower substrate. Materials and structures of the polarizing plate 300 are not particularly limited. A backlight unit (e.g., emitting a blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any polarizer that can be used in a liquid crystal display device. The polarizing plate may be triacetyl cellulose (TAC) having a thickness of less than or equal to about 200 μm, but is not limited thereto. In another embodiment, the upper optical element may be a coating that controls a refractive index without a polarization function.

The backlight unit includes alight source 110. The light source may emit a blue light or a white light. The light source may include, but is not limited to, a blue LED, a white LED, a white OLED, or a combination thereof.

The backlight unit may further include a light guide plate 120. In one or more embodiments, the backlight unit may be of an edge type. For example, the backlight unit may include a reflector (not shown), a light guide plate (not shown) provided on the reflector and providing a planar light source to the liquid crystal panel 200, and/or at least one optical sheet (not shown) on the light guide plate, for example, a diffusion plate, a prism sheet, and the like, but the present disclosure is not limited thereto. The backlight unit may not include a light guide plate. In one or more embodiments, the backlight unit may be direct lighting. For example, the backlight unit may have a reflector (not shown) and a plurality of fluorescent lamps on the reflector at regular intervals, or may have an LED operating substrate on which a plurality of light emitting diodes, a diffusion plate thereon, and optionally at least one optical sheet may be disposed. Details (e.g., each component of a light emitting diode, a fluorescent lamp, a light guide plate, various optical sheets, and a reflector) of such a backlight unit are known and are not particularly limited.

A black matrix 241 may be provided under the transparent substrate 240 and has openings and hides a gate line, a data line, and a thin film transistor of the wire plate on the lower substrate. For example, the black matrix 241 may have a grid shape. The photoluminescent layer 230 is provided in the opening of the black matrix 241 and has a nanoparticle-polymer composite pattern including a first region R configured to emit a first light (e.g., a red light), a second region G configured to emit a second light (e.g., a green light), and a third region B configured to emit/transmit a third light, for example a blue light. If desired, the photoluminescent layer may further include at least one fourth region. The fourth region may include a quantum dot that emits light of a different color from the light emitted from the first to third regions (e.g., cyan, magenta, and yellow light).

In the photoluminescent layer 230, sections forming the pattern may be repeated corresponding to pixel areas formed on the lower substrate. A transparent common electrode 231 may be provided on the photoluminescent layer 230.

The third region (B) configured to emit/transmit a blue light may be a transparent color filter that does not change the emission spectrum of the light source. In this case, the blue light emitted from the backlight unit may enter in a polarized state and may be emitted through the polarizing plate and the liquid crystal layer as is. If needed, the third region may include a quantum dot emitting a blue light.

As described herein, if desired, the display device or light emitting device according to one or more embodiments may further include an excitation light blocking layer or a first optical filter layer (hereinafter, referred to as a first optical filter layer). The first optical filter layer may be disposed between the bottom surface of the first region (R) and the second region (G) and the substrate (e.g., the upper substrate 240) or on the upper surface of the substrate. The first optical filter layer may be a sheet having an opening in a portion corresponding to a pixel area (third region) displaying blue, and thus may be formed in portions corresponding to the first and second regions. That is, the first optical filter layer may be integrally formed at positions other than the position overlapped with the third region as shown in FIGS. 1A, 1B, 6 and/or 7A, but is not limited thereto. Two or more first optical filter layers may be spaced apart from each other at positions overlapped with the first and second regions, and optionally, the third region. When the light source includes a green light emitting device, a green light blocking layer may be disposed on the third region.

The first optical filter layer may block light, for example, in a predetermined wavelength region in the visible light region and may transmit light in the other wavelength regions, and for example, it may block a blue light (or a green light) and may transmit light except the blue light (or the green light). The first optical filter layer may transmit, for example, a green light, a red light, and/or a yellow light that is a mixed color thereof. The first optical filter layer may transmit a blue light and block a green light, and may be disposed on the blue light emitting pixel.

The first optical filter layer may substantially block excitation light and transmit light in a desired wavelength region. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit a red light may be disposed at a position overlapped with the red light emitting section, and the first optical filter layer configured to selectively transmit a green light may be disposed at a position overlapped with the green light emitting section. The first optical filter layer may include a first filter region that blocks (e.g., absorbs) the blue light and the red light and selectively transmits light of a predetermined range (e.g., greater than or equal to about 500 nm, greater than or equal to about 510 nm, or greater than or equal to about 515 nm to less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second filter region that blocks (e.g., absorbs) a blue light and a green light and selectively transmits light of a predetermined range (e.g., greater than or equal to about 600 nm, greater than or equal to about 610 nm, or greater than or equal to about 615 nm to less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or the first filter region and the second filter region. In one or more embodiments, the light source may emit a blue and a green mixed light, and the first optical filter layer may further include a third filter region that selectively transmits a blue light and blocks a green light.

The first filter region may be disposed at a position overlapped with the green light emitting section. The second filter region may be disposed at a position overlapped with the red light emitting section. The third filter region may be disposed at a position overlapped with the blue light emitting section.

The first filter region, the second filter region, and, optionally, the third filter region may be optically isolated. Such a first optical filter layer may contribute to improvement of color purity of the display device.

The display device may further include a second optical filter layer (e.g., a recycling layer of red/green light or yellow light) that is disposed between the photoluminescent layer and the liquid crystal layer (e.g., between the photoluminescent layer and the upper polarizing plate), transmits at least a portion of the third light (excitation light), and reflects at least a portion of the first light and/or the second light. The first light may be a red light, the second light may be a green light, and the third light may be a blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second regions to be emitted to the outside of the display device.

The second optical filter layer or the first optical filter layer may be formed as an integrated layer having a relatively planar surface.

The first optical filter layer may include a polymer thin film including a dye and/or a pigment absorbing light in a wavelength which is to be blocked. The second optical filter layer or the first optical filter layer may include a single layer having a low refractive index, and may be, for example, a transparent thin film having a refractive index of less than or equal to about 1.4:1, less than or equal to about 1.3, or less than or equal to about 1.2. The second optical filter layer or the first optical filter layer having a low refractive index may include, for example, a porous silicon oxide, a porous organic material, a porous organic-inorganic composite, or the like, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Figure 7B:
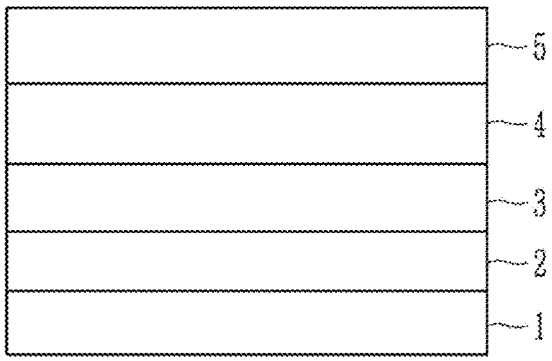
FIG. 7B is a schematic cross-sectional view of an electronic device (e.g., an electroluminescent device) according to one or more embodiments.

In one or more embodiments, the electronic device may include a light emitting device (e.g., an electroluminescent device) including the nanoparticles described above. FIG. 7B is a schematic cross-sectional view of a light emitting device (electroluminescent device) according to one or more embodiments. Referring to FIG. 7B, the light emitting device includes an anode 1 and a cathode 5 facing each other; a quantum dot light emitting layer 3 disposed between the anode and the cathode and including a plurality of quantum dots; and a hole auxiliary layer 2 located between the anode and the quantum dot light emitting layer. The hole auxiliary layer may further include a hole injecting layer (HIL), a hole transporting layer (HTL), an electron blocking layer (EBL), or a combination thereof. The hole auxiliary layer may include any organic/inorganic material having hole characteristics. The quantum dot light emitting device may further include an electron auxiliary layer 4 located between the cathode and the quantum dot light emitting layer. The electron auxiliary layer may include an electron injecting layer (EIL), an electron transporting layer (ETL), a hole blocking layer (HBL), or a combination thereof. The electron auxiliary layer may include any organic/inorganic material having electronic properties.

Hereinafter, the exemplary embodiments are illustrated in further detail with reference to examples. However, embodiments of the present disclosure are not limited to the examples.

EXAMPLES

Analysis Methods

[1] Photoluminescence Analysis

A photoluminescence (PL) spectrum of the nanoparticles produced and a composite including the same was obtained using a Hitachi F-7000 spectrophotometer at an excitation wavelength of 450 nm.

[2] ICP Analysis

Inductively coupled plasma atomic emission spectroscopy (ICP-AES) was performed using a Shimadzu ICPS-8100.

[3] Blue Light Absorbance and Light Conversion Efficiency (CE) for Composite

An amount of incident light of a wavelength of 450 nm (B) was measured by using an integrating (hemi)sphere of an absolute quantum efficiency-measuring device (e.g., QE-2100, Otsuka Electronics Co., Ltd.). Subsequently, a QD polymer composite that may be referred to as a first composite was placed in the integrating hemisphere, and the incident light was irradiated to measure an amount of first light from the composite (A), and an amount of the incident light passing the composite (B'), respectively.

Using the measured amounts, an incident light absorbance and the light conversion efficiency were calculated according to the following equation.

$$\text{incident light absorbance (\%)} = [(B - B')/B] \times 100\%$$

$$\text{Light conversion efficiency (\%)} = [A/(B - B')] \times 100\%$$

wherein, in the equations,

A is an amount of a first light emitted from the first composite,

B is an amount of incident light provided to the first composite, and

B' is an amount of incident light passing through the first composite

[4] Transmission Electron Microscope (TEM) Analysis and TEM-EDX (Energy Dispersive Spectroscopy) Analysis Transmission electron microscope analysis and EELS analysis of the produced nanoparticles were performed using a UT F30 Tecnai electron microscope.

Reference Example 1

Silver acetate was dissolved in oleylamine to provide a 0.06 molar (M) silver precursor containing solution (hereinafter, a silver precursor). Sulfur was dissolved in oleylamine to provide a 1 M sulfur precursor containing solution (hereinafter, a sulfur precursor). Indium chloride was dissolved in ethanol to provide a 1 M indium precursor containing solution (hereinafter, an indium precursor).

Gallium acetylacetonate, octadecene (ODE), and dodecanethiol were placed in a 100 milliliter (mL) reaction flask and heated at 120° C. for 10 minutes under vacuum. After allowing the flask to cool to room temperature nitrogen gas was added to the flask, and the silver precursor, the sulfur precursor, and the indium precursor were added to the flask. The flask was heated at a reaction temperature of 210° C., and a reaction proceeds for 60 minutes. After decreasing the temperature of the flask to 180° C., trioctylphosphine (TOP) was added to the flask, followed by the additional of hexane and ethanol to the obtained mixture to facilitate precipitation. The precipitate (i.e., first semiconductor nanocrystal) was separated via centrifugation.

A mole ratio among the added indium precursor, the gallium acetylacetonate, and the sulfur precursor was 1:2.3:4.8.

Gallium chloride was dissolved in toluene to provide a 4.5 M gallium precursor containing solution (hereinafter, a gallium precursor).

Dimethylthiourea (DMTU) and oleyl amine were placed in a reaction flask and then, vacuum-treated at 120° C. for 10 minutes. Nitrogen gas was added to the reaction flask and the flask was then heated to 240° C. The first semiconductor nanocrystal obtained above, the gallium precursor, and a silver compound (e.g., silver acetate) were added to the reaction flask. The reaction flask was then heated to 280° C. (a second temperature) for about 40 minutes. The reaction solution was cooled to 180° C. and trioctylphosphine was added to the solution, and the solution cooled to room temperature. Hexane and ethanol were added to facilitate precipitation of a first particle, which was separated and recovered via centrifugation. The separated solid was then dispersed in toluene.

A mole ratio of the gallium precursor to the sulfur precursor was 1:1.3. The amount of the silver compound is 3.5 mol % (molar percentage) compared to the gallium precursor.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Example 1

Zinc chloride was dissolved in trioctylphosphine (TOP) to provide a 0.5 M zinc precursor containing solution (hereinafter, "zinc precursor").

Dimethylthiourea (DMTU) was dissolved in a mixed solvent of oleylamine and octadecene in a 100 mL flask at a concentration of 0.5 M, and the flask was vacuum-treated at 120° C. for 10 minutes. Nitrogen gas was added to the flask and the flask was heated to 210° C. The first particle as prepared in Reference Example 1 and the zinc precursor were added to the flask and a reaction proceeded for 40 minutes. The reaction solution was cooled to 180° C. and trioctylphosphine was added, and the reaction flask was cooled to room temperature. Hexane and ethanol were added thereto to facilitate precipitation of semiconductor nanoparticles. The semiconductor nanoparticles were separated and recovered through centrifugation, and then dispersed in toluene.

The molar ratio of the zinc precursor and the sulfur precursor as used is 1:1.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Figure 8A:
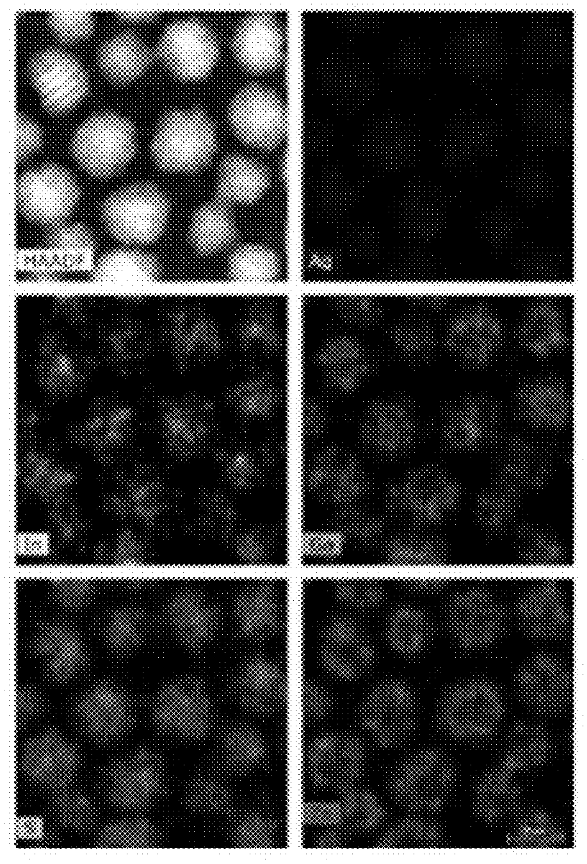
FIGS. 8A and 8B illustrate mapping results of transmission electron microscope energy dispersive spectroscopy (TEM-EDX) of semiconductor nanoparticles of Example 1.
Figure 8B:
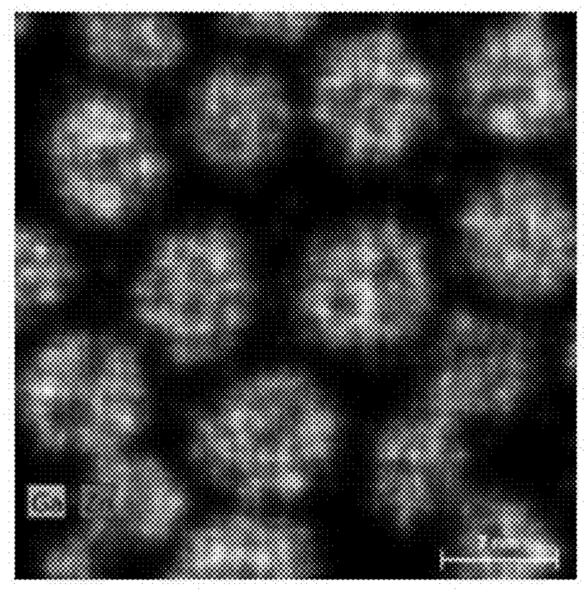

A TEM-EDS mapping analysis was performed on the obtained nanoparticles and the results are shown in FIGS. 8A and 8B. From the TEM-EDX micrographs of FIGS. 8A and 8B, it is confirmed that the obtained particles include silver, indium, gallium, and zinc, with the indium inside the particle and a higher content of zinc proximate to a surface of the particle than in an inner portion of the particle.

Example 2

A semiconductor nanoparticle was prepared in the same manner as in Example 1, except that the amount of the zinc precursor was increased two times (2X, doubled).

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Example 3

A semiconductor nanoparticle was prepared in the same manner as in Example 1, except that the amount of the zinc precursor was increased 3.5 times.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Comparative Example 1

The semiconductor nanoparticle was prepared in the same manner as Example 2, except that the reaction temperature was 150° C.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Comparative Example 2

The semiconductor nanoparticle was prepared in the same manner as Example 2, except that the reaction temperature was 180° C.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Comparative Example 3

The semiconductor nanoparticle was prepared in the same manner as Example 2, except that the reaction temperature was 240° C.

An ICP-AES analysis was performed with respect to the obtained semiconductor nanoparticle, and the results are shown in Table 1. A photoluminescence analysis was performed with respect to the obtained semiconductor nanoparticle, and the results are shown in Table 2.

Experimental Example 1: Production of a Composite and Evaluation of Luminescent Properties Thereof A toluene solution of the semiconductor nanoparticle prepared in each of Examples 1, 2, and 3, Reference Example 1, and Comparative Examples 1, 2, and 3 was mixed with a binder (a quaternary copolymer of methacrylic acid, benzyl methacrylate, hydroxyethylmethacrylate, and styrene, having an acid value of 130 mg KOH/g, and a molecular weight of 8000 grams per mole) solution (in PGMEA (propylene glycol methyl ether acetate), at a concentration 30 wt %) to obtain a semiconductor nanoparticle-binder dispersion.

To each of semiconductor nanoparticle-binder dispersion, hexaacrylate with the following structure as a photopolymerizable monomer, ethylene glycol bis(3-mercaptopropionate) (hereinafter, 2T), an oxime-ester compound as an initiator, $TiO_2$ as a light diffusing agent, and PGMEA were added and mixed together to provide a composition.

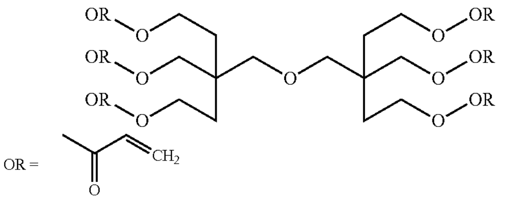

The compositions prepared included 20 wt % of semiconductor nanoparticles based on a total solid weight of the compositions.

Each of the compositions were respectively spin-coated on a glass substrate at 600 revolutions per minute (rpm) for 5 seconds to obtain a film. The film thus obtained was pre-baked (PRB) at 100° C. The pre-baked film was irradiated with light (at a wavelength of 365 nm and an intensity of 4J) and heated at 180° C. for 30 minutes (POB) to obtain a nanoparticle-polymer composite film (having a thickness of about 7 μm).

For each of the patterned films thus obtained, a light conversion efficiency (CE), absorbance, and a process maintenance ratio of the composite were measured and the results are shown in Table 3.

TABLE 3-continued

| Semiconductor nanoparticle in the composite | CE of the composite | Thermal stability of the composite | absorbance |
|---|---|---|---|
| Comp. Example 2 | 14% | 57% | Above 90% |
| Comp. Example 3 | 19% | 70% | Above 90% |

Thermal stability of the composite (%) = [the light conversion efficiency (CE) of the composite after POB process/CE of the composite after the PRB process] x 100

As confirmed from the results of Tables 2 and 3, the nanoparticles according to Examples may exhibit improved light emission characteristics and stability compared to Comparative Examples.

Experimental Example 2: Evaluation of Stability in the Air of Films

In the same manner as in Experimental Example 1, a composite including the semiconductor nanoparticles of Example 1, Example 2, Example 3, and Reference Example 1 was prepared, respectively and the prepared film was left at room temperature in air for 48 hours, and the initial luminescent efficiency of the composite and the luminescent efficiency after 48 hours were measured to measure stability (relative luminescent efficiency) for 48 hours. The measured results are summarized in Table 4.

TABLE 1

| | S:In | Ag:In | Ga:In | Zn:In | Relative mole value of Zn | CBV | Ga:Ag |
|---|---|---|---|---|---|---|---|
| Example 1 | 11.1 | 2.67 | 3.78 | 3.33 | 0.31 | 1.07 | 1.42 |
| Example 2 | 14.3 | 2.28 | 3.71 | 5.14 | 0.43 | 0.94 | 1.63 |
| Example 3 | 14.3 | 1.14 | 3.14 | 10.3 | 0.66 | 1.19 | 2.75 |
| Comp. Example 1 | 5.56 | 2.22 | 2.89 | 1.17 | 0.16 | 1.46 | 1.3 |
| Comp. Example 2 | 8.33 | 2 | 2.83 | 3.58 | 0.38 | 1.24 | 1.42 |
| Comp. Example 3 | 11.6 | 2.6 | 3.4 | 3.6 | 0.16 | 0.99 | 1.3 |
| Ref. Example 1 | 7.69 | 3.23 | 4.31 | 0 | 0 | 1.25 | 1.3 |

Relative molar value of Zn = [Zn]/([Ag] + [In] + [Ga] + [Zn])CBV (charge balance value) = {[Ag] + 3([In] + [Ga]) + 2[Zn]}/(2[S])
wherein [Ag], [In], [Ga], [Zn], and [S] are the molar amounts of silver, indium, gallium, zinc, and sulfur in the nanoparticles, respectively.

TABLE 2

| | PWL (nm) | FWHM (nm) |
|---|---|---|
| Example 1 | 522 | 34 |
| Example 2 | 532 | 33 |
| Example 3 | 525 | 35 |
| Comp. Example 1 | 528 | 33 |
| Comp. Example 2 | 528 | 32 |
| Comp. Example 3 | 527 | 34 |
| Ref. Example 1 | 519 | 37 |

PWL: peak emission wavelength
FWHM: full width at half maximum

TABLE 3

| Semiconductor nanoparticle in the composite | CE of the composite | Thermal stability of the composite | absorbance |
|---|---|---|---|
| Example 1 | 20% | 70% | Above 90% |
| Example 2 | 19% | 71% | Above 90% |
| Example 3 | 18.1% | 76.5% | Above 90% |
| Comp. Example 1 | 13% | 53% | Above 90% |

TABLE 4

| Semiconductor nanoparticle in the composite | 48 hours stability |
|---|---|
| Example 1 | 67% |
| Example 2 | 75% |
| Example 3 | 78% |
| Reference Example 1 | 50% |

From the results of Table 4, it is confirmed that the semiconductor nanoparticles of Examples 1, 2, and 3 may exhibit significantly improved stability compared to the semiconductor nanoparticles of Reference Example 1 not including the ZnS semiconductor nanocrystal layer.

Experimental Example 3: Comparison of Emission Efficiency Excluding Trap Emission The tail emission percentage in the wavelength range of greater than the emission peak wavelength+50 nm was measured for the composites including the semiconductor nanoparticles of Example 1 and Comparative Example 3, respectively. As a result, it was confirmed that the tail emission percentage of the composite including the semiconductor nanoparticles of Comparative Example 3 was 1.3 times greater than the tail emission percentage of the composite including the semiconductor nanoparticles of Example 1. The above results suggest that the tail emission accounts for a considerably large portion in the light conversion efficiency (CE, 19%) of the composite including the semiconductor nanoparticles of Comparative Example 3.

While this disclosure has been described in connection with what is presently considered to be practical embodiments, it is to be understood that the present subject matter is not limited to the disclosed exemplary embodiments. On the contrary, it is intended to cover various modifications and equivalent arrangements included within the spirit and scope of the appended claims.

What is claimed is:

1. A semiconductor nanoparticle comprises silver, indium, gallium, and sulfur, wherein the semiconductor nanoparticle is configured to emit a green light, wherein the semiconductor nanoparticle has a relative mole value of zinc as defined by Equation 1 that is greater than or equal to about 0.25 and less than or equal to about 0.9:

$$\text{Relative mole value of zinc} = [Zn]/([Ag]+[In]+[Ga]+[Zn]) \quad \text{Equation 1}$$

wherein, in Equations 1 and 2, [Ag], [In], [Ga], and [Zn] are molar amounts of the silver, the indium, the gallium, and the zinc in the semiconductor nanoparticle, respectively, and wherein the semiconductor nanoparticle has a charge balance value defined by Equation 2 that is greater than or equal to about 0.91 and less than or equal to about 1.2:

$$\text{charge balance value} = \{[Ag]+3([In]+[Ga])+2[Zn]\}/2[S], \quad \text{Equation 2}$$

wherein in the semiconductor nanoparticle, a mole ratio of gallium to indium (Ga:In) is greater than or equal to about 2.9:1 and less than or equal to about 4.5:1.

2. The semiconductor nanoparticle of claim 1, wherein the charge balance value is greater than or equal to about 0.93 and less than or equal to about 1.17.

3. The semiconductor nanoparticle of claim 1, wherein in the semiconductor nanoparticle, the relative mole value of zinc is greater than or equal to about 0.28 and less than or equal to about 0.66.

4. The semiconductor nanoparticle of claim 1, wherein in the semiconductor nanoparticle, a mole ratio of zinc to indium (Zn:In) is greater than or equal to about 2.7:1 and less than or equal to about 10.5:1, and a mole ratio of gallium to silver (Ga:Ag) is greater than or equal to about 1.1:1 and less than or equal to about 3:1.

5. The semiconductor nanoparticle of claim 1, wherein in the semiconductor nanoparticle, a mole ratio of gallium to a sum of gallium, indium, and silver (Ga:(Ga+In+Ag)) is greater than or equal to about 0.45:1 and less than or equal to about 0.7:1, a mole ratio of zinc to sulfur (Zn:S) is greater than or equal to about 0.1:1 and less than or equal to about 0.8:1, or a mole ratio of a sum of indium and gallium to sulfur ((In+Ga):S) is greater than or equal to about 0.1:1 and less than or equal to about 0.8:1.

6. The semiconductor nanoparticle of claim 1, wherein in the semiconductor nanoparticle, a mole ratio of silver to a sum of silver, indium, and gallium (Ag:(Ag+In+Ga)) is greater than or equal to about 0.2:1 and less than or equal to about 0.5:1, or a mole ratio of sulfur to a sum of silver, indium, and gallium (S/(Ag+In+Ga)) is greater than or equal to about 1:1 and less than or equal to about 2.5:1.

7. The semiconductor nanoparticle of claim 1, wherein the semiconductor nanoparticle comprises a first particle comprising silver, indium, gallium, and sulfur, and a semiconductor nanocrystal layer disposed on the first particle and comprising zinc and sulfur.

8. The semiconductor nanoparticle of claim 1, wherein a peak emission wavelength of the green light is greater than or equal to about 500 nm and less than or equal to about 580 nm, and the semiconductor nanoparticle has a quantum yield of greater than or equal to about 70% and less than or equal to about 99%.

9. The semiconductor nanoparticle of claim 1, wherein the semiconductor nanoparticle has a full width at half maximum of less than or equal to about 40 nm.

10. The semiconductor nanoparticle of claim 1, wherein the semiconductor nanoparticle exhibits a trap emission percentage of less than or equal to about 25% as defined by the following formula:

Trap emission percentage (%)=[trap emission area in an emission spectrum/a total area of the emission spectrum]×100 wherein the trap emission area is a peak area corresponding to a wavelength of greater than a peak emission wavelength plus 50 nm.

11. A method of manufacturing the semiconductor nanoparticle of claim 1, which comprises:

reacting a zinc precursor with a sulfur precursor in the presence of a first particle containing indium, gallium, silver, and sulfur to form a semiconductor nanocrystal layer containing zinc and sulfur on the first particle, wherein the reaction comprises adding the first particle and the zinc precursor to a reaction medium including the sulfur precursor and a first organic solvent, and a reaction temperature is greater than about 180° C. and less than about 240° C.

12. The method of claim 11, wherein the sulfur precursor comprises a thiol compound, an isothiocyanate compound, a thiourea compound, a thioacetamide compound, or a combination thereof, and the zinc precursor comprises a zinc halide.

13. The method of claim 11, wherein the reaction temperature is greater than or equal to about 205° C. and less than or equal to about 215° C., and a reaction time is greater than or equal to about 30 minutes and less than or equal to about 2 hours.

14. The method of claim 11, wherein the organic solvent comprises a mixture of a C5 to C40 aliphatic hydrocarbon solvent and a C5 to C40 amine solvent.

15. A composite comprising a matrix and a semiconductor nanoparticle of claim 1 dispersed in the matrix.

16. The composite of claim 15, wherein the composite exhibits a relative luminescent efficiency of greater than or equal to about 60% and the relative luminescent efficiency is defined by the following equation:

relative luminescent efficiency (%)=[luminescent efficiency of the composite after 48 hours/Initial luminescent efficiency of the composite]×100.

17. A color conversion structure, which comprises:

a color conversion layer comprising a color conversion region and optionally a partition wall defining the color conversion region, wherein the color conversion region comprises a first region corresponding to a first pixel, and the first region comprises the semiconductor nanoparticle of claim 1.

18. An electronic device, comprising the semiconductor nanoparticle of claim 1.

* * * * *